(12) United States Patent
Lee et al.

(10) Patent No.: US 9,379,252 B2
(45) Date of Patent: Jun. 28, 2016

(54) THIN FILM TRANSISTOR AND THIN FILM TRANSISTOR ARRAY PANEL INCLUDING THE SAME

(71) Applicant: SAMSUNG DISPLAY CO., LTD., Yongin, Gyeonggi-Do (KR)

(72) Inventors: Yong Su Lee, Gyeonggi-do (KR); Yoon Ho Khang, Gyeonggi-do (KR); Dong Jo Kim, Gyeonggi-do (KR); Hyun Jae Na, Seoul (KR); Sang Ho Park, Gyeonggi-do (KR); Se Hwan Yu, Seoul (KR); Chong Sup Chang, Gyeonggi-do (KR); Dae Ho Kim, Daegu (KR); Jae Neung Kim, Seoul (KR); Myoung Geun Cha, Seoul (KR); Sang Gab Kim, Seoul (KR); Yu-Gwang Jeong, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/666,461

(22) Filed: Mar. 24, 2015

(65) Prior Publication Data
US 2015/0194534 A1 Jul. 9, 2015

Related U.S. Application Data

(63) Continuation of application No. 14/184,361, filed on Feb. 19, 2014, now Pat. No. 8,987,047, which is a continuation-in-part of application No. 13/553,418, filed on Jul. 19, 2012, now Pat. No. 8,664,654.

(30) Foreign Application Priority Data

Apr. 2, 2012   (KR) .................. 10-2012-0034099
Oct. 31, 2013  (KR) .................. 10-2013-0131410

(51) Int. Cl.
*H01L 27/00* (2006.01)
*H01L 29/00* (2006.01)
*H01L 29/786* (2006.01)
*H01L 27/12* (2006.01)
*H01L 29/66* (2006.01)
*H01L 29/417* (2006.01)

(52) U.S. Cl.
CPC ........ *H01L 29/7869* (2013.01); *H01L 27/1225* (2013.01); *H01L 29/41733* (2013.01);
(Continued)

(58) Field of Classification Search
CPC .................. H01L 29/66969; H01L 29/78696; H01L 29/41733; H01L 29/78618; H01L 29/78633; H01L 29/7869; H01L 27/1225; H01L 27/1285; H01L 27/1288
See application file for complete search history.

(56) References Cited

U.S. PATENT DOCUMENTS 6,391,694 B1   5/2002   Zhang et al.
6,590,229 B1   7/2003   Yamazaki et al.
(Continued)

FOREIGN PATENT DOCUMENTS

KR   1020120034982   4/2012
WO   WO 2011045960   4/2011

*Primary Examiner* — Nikolay Yushin
(74) *Attorney, Agent, or Firm* — F. Chau & Associates, LLC

(57) ABSTRACT

A thin film transistor according to an exemplary embodiment of the present invention includes an oxide semiconductor. A source electrode and a drain electrode face each other. The source electrode and the drain electrode are positioned at two opposite sides, respectively, of the oxide semiconductor. A low conductive region is positioned between the source electrode or the drain electrode and the oxide semiconductor. An insulating layer is positioned on the oxide semiconductor and the low conductive region. A gate electrode is positioned on the insulating layer. The insulating layer covers the oxide semiconductor and the low conductive region. A carrier concentration of the low conductive region is lower than a carrier concentration of the source electrode or the drain electrode.

12 Claims, 42 Drawing Sheets

(52) U.S. Cl.
CPC .... *H01L29/66969* (2013.01); *H01L 29/78618* (2013.01); *H01L 29/78633* (2013.01); *H01L 29/78696* (2013.01)

(56) References Cited

U.S. PATENT DOCUMENTS

| | | | |
|---|---|---|---|
| 7,649,205 | B2 | 1/2010 | Lujan et al. |
| 7,683,382 | B2 * | 3/2010 | Jung et al. ........................ 257/83 |
| 7,816,721 | B2 * | 10/2010 | Yamazaki et al. ............ 257/306 |
| 8,030,643 | B2 | 10/2011 | Asami et al. |
| 8,144,102 | B2 | 3/2012 | Takatoku |
| 8,941,112 | B2 | 1/2015 | Yamazaki |
| 2002/0163016 | A1 * | 11/2002 | Shibata ............. G02F 1/136209 257/200 |
| 2006/0244696 | A1 * | 11/2006 | Jung et al. ........................ 345/77 |
| 2007/0145369 | A1 | 6/2007 | Kwak |
| 2008/0042180 | A1 * | 2/2008 | Yamazaki et al. ............ 257/306 |
| 2009/0283763 | A1 | 11/2009 | Park et al. |
| 2011/0272696 | A1 | 11/2011 | Ryu et al. |
| 2012/0161121 | A1 | 6/2012 | Yamazaki |
| 2012/0223308 | A1 | 9/2012 | Okabe et al. |
| 2015/0194534 | A1 | 7/2015 | Lee et al. |

* cited by examiner

THIN FILM TRANSISTOR AND THIN FILM TRANSISTOR ARRAY PANEL INCLUDING THE SAME

CROSS-REFERENCE TO RELATED APPLICATION

This application is a continuation application of U.S. application Ser. No. 14/184,361, filed on Feb. 19, 2014, which is a continuation-in-part of U.S. application Ser. No. 13/553,418, filed on Jul. 19, 2012, issued as U.S. Pat. No. 8,664,654 on Mar. 4, 2014, which claims priority to Korean Patent Application No. 10-2012-0034099 filed in the Korean Intellectual Property Office on Apr. 2, 2012, and the continuation-in-part application claims priority to Korean Patent Application No. 10-2012-0034099 filed in the Korean Intellectual Property Office on Apr. 2, 2012 and Korean Patent Application No. 10-2013-0131410 filed in the Korean Intellectual Property Office on Oct. 31, 2013, the disclosures of which are incorporated by reference herein in their entireties.

TECHNICAL FIELD

Embodiments of the present invention relate to a thin film transistor, a thin film transistor array panel including the same, and a method of manufacturing the same.

DISCUSSION OF THE RELATED ART

Thin film transistors (TFTs) are used in various electronic devices, such as flat panel displays. For example, thin film transistors are used as switching elements or driving elements in a flat panel display, such as a liquid crystal display (LCD), an organic light emitting diode (OLED) display, and an electrophoretic display. A thin film transistor includes a gate electrode connected to a gate line to transmit a scanning signal, a source electrode connected to a data line to transmit a signal applied to a pixel electrode, a drain electrode that faces the source electrode, and a semiconductor electrically connected to the source electrode and the drain electrode. The semiconductor is a factor in determining characteristics of the thin film transistor. The semiconductor may include silicon (Si). The silicon may be amorphous silicon or polysilicon according to a crystallization type thereof. Amorphous silicon allows for a simpler manufacturing process and has relatively low charge mobility. Polysilicon, which has relatively high charge mobility, is subjected to a crystallizing process, such that manufacturing cost is increased and the process is complicated. To address the properties of amorphous silicon and polysilicon, there is research on thin film transistors using an oxide semiconductor having high uniformity. The oxide semiconductor can have higher electron mobility, a higher ON/OFF ratio, and a lower cost than those of amorphous silicon and/or polysilicon. If parasitic capacitance is generated between the gate electrode and the source electrode or the drain electrode of a thin film transistor, characteristics of the thin film transistor as a switching element may be deteriorated.

SUMMARY

A thin film transistor according to an exemplary embodiment of the present invention includes an oxide semiconductor. A source electrode and a drain electrode face each other. The source electrode and the drain electrode are positioned at two opposite sides, respectively, of the oxide semiconductor. A low conductive region is positioned between the source electrode or the drain electrode and the oxide semiconductor. An insulating layer is positioned on the oxide semiconductor and the low conductive region. A gate electrode is positioned on the insulating layer. The insulating layer covers the oxide semiconductor and the low conductive region. A carrier concentration of the low conductive region is lower than a carrier concentration of the source electrode or the drain electrode.

A thin film transistor array panel according to an exemplary embodiment of the present invention includes an insulation substrate. An oxide semiconductor is positioned on the insulation substrate. A source electrode and a drain electrode face each other. The source electrode and the drain electrode are positioned at two opposite sides, respectively, of the oxide semiconductor. A low conductive region is positioned between the source electrode or the drain electrode and the oxide semiconductor. An insulating layer is positioned on the oxide semiconductor and the low conductive region. A gate electrode is positioned on the insulating layer. The insulating layer covers the oxide semiconductor and the low conductive region. A carrier concentration of the low conductive region is lower than a carrier concentration of the source electrode or the drain electrode.

The source electrode and the drain electrode may include a material reduced from a material of the oxide semiconductor.

An edge boundary of the gate electrode may be positioned inside an edge boundary of the insulating layer.

The carrier concentration of the low conducive region may be gradually varied in the low conductive region.

The edge boundary of the insulating layer may be substantially aligned to a boundary between the low conductive region and the source electrode or the drain electrode.

The edge boundary of the gate electrode may be substantially aligned to an edge boundary of the oxide semiconductor.

A buffer layer positioned between the insulation substrate and the oxide semiconductor may be further included.

At least one of the buffer layer or the insulating layer may include an insulating oxide.

A method of manufacturing a thin film transistor array panel according to an exemplary embodiment of the present invention includes forming a semiconductor pattern. The semiconductor pattern includes an oxide semiconductor material. An insulating layer and a gate electrode are formed. The insulating layer and the gate electrode cross and overlap a center portion of the semiconductor pattern. The semiconductor pattern that is not covered by the insulating layer and the gate electrode is reduced, forming a semiconductor, a low conductive region, and a source electrode and a drain electrode facing each other with respect to the semiconductor. The low conductive region is positioned between the semiconductor and the source electrode or the drain electrode. The insulating layer covers the oxide semiconductor and the low conductive region. A carrier concentration of the low conductive region is lower than a carrier concentration of the source electrode or the drain electrode.

In the method, an insulating material layer is formed on the semiconductor pattern. A gate layer is formed on the insulating material layer. The gate layer includes a conductive material. A photosensitive film pattern is formed on the gate layer. The gate layer is patterned by using the photosensitive film pattern as an etching mask, forming the gate electrode. The insulating material layer is patterned by using the photosensitive film pattern as an etching mask, forming the insulating layer and expose a portion of the semiconductor pattern.

In the method, a semiconductor layer including an oxide semiconductor material, an insulating material layer including an insulating material, and a gate layer including a conductive material are sequentially formed. A first photosensitive film pattern is formed on the gate layer. The first photosensitive film pattern includes portions respectively having different thicknesses from each other. The gate layer, the insulating material layer, and the semiconductor layer are sequentially etched by using the first photosensitive film pattern, forming the semiconductor pattern. A portion of the first photosensitive film pattern is removed, forming a second photosensitive film pattern. The gate layer is patterned by using the second photosensitive film pattern as an etching mask, forming the gate electrode. The insulating material layer is patterned by using the second photosensitive film pattern as an etching mask, forming the insulating layer and expose a portion of the semiconductor pattern.

An edge boundary of the gate electrode may be positioned inside an edge boundary of the insulating layer.

The carrier concentration of the low conductive region may be gradually varied in the low conductive region.

A metal component of the oxide semiconductor material may be extracted to a surface of at least one of the source electrode, the drain electrode, or the low conductive region.

The semiconductor, the low conductive region, the source electrode, and the drain electrode may be formed using a reduction treatment method using plasma.

According to an exemplary embodiment of the present invention, a thin film transistor includes a source electrode, a drain electrode, a gate electrode, and a semiconductor layer. The source electrode and the drain electrode are disposed on a substrate. The source electrode and the drain electrode are spaced apart from each other. The semiconductor layer is disposed on the substrate between the source electrode and the drain electrode. A low conductive layer is disposed on the substrate between the source electrode or the drain electrode and the semiconductor layer. An insulating layer is disposed on the semiconductor layer and the low conductive layer. The gate electrode is disposed on the insulating layer. A carrier concentration of the low conductive layer decreases from the drain or source electrode to the semiconductor layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1A:
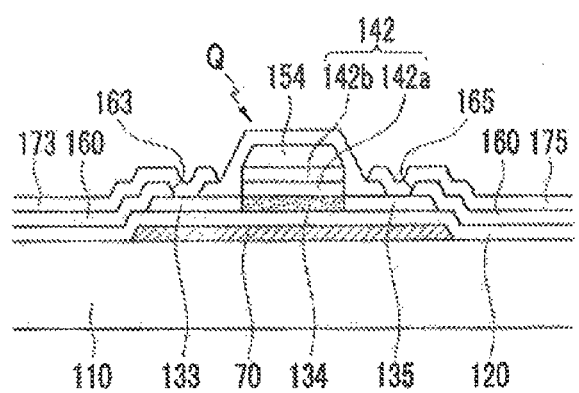
FIG. 1A is a cross-sectional view illustrating a thin film transistor array panel including a thin film transistor according to an exemplary embodiment of the present invention.

The embodiments of the present invention will be hereinafter described in greater detail with reference to the accompanying drawings. As those skilled in the art would realize, the described embodiments may be modified in various different ways, all without departing from the spirit or scope of the present invention. Like reference numerals may designate like or similar elements throughout the specification and the drawings. It will be understood that when an element such as a layer, film, region, or substrate is referred to as being "on", "connected to", or "coupled to" another element, it can be directly on, connected or coupled to the other element or intervening elements may also be present. As used herein, the singular forms, "a", "an", and "the" are intended to include the plural forms as well, unless the context clearly indicates otherwise.

Figure 1B:
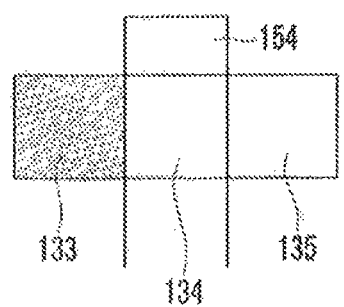
FIG. 1B is a plan view of the thin film transistor array panel of FIG. 1A.
Figure 2:
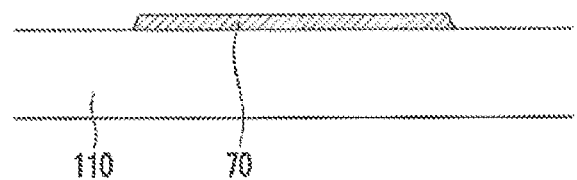
FIG. 2, FIG. 3, FIG. 4, FIG. 5, FIG. 6, FIG. 7, FIG. 8, FIG. 9, and FIG. 10 are cross-sectional views sequentially showing a method of manufacturing the thin film transistor array panel shown in FIG. 1 according to an exemplary embodiment of the present invention.
Figure 3:
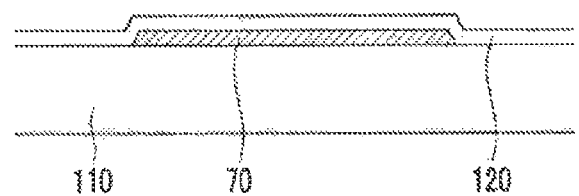
Figure 4:
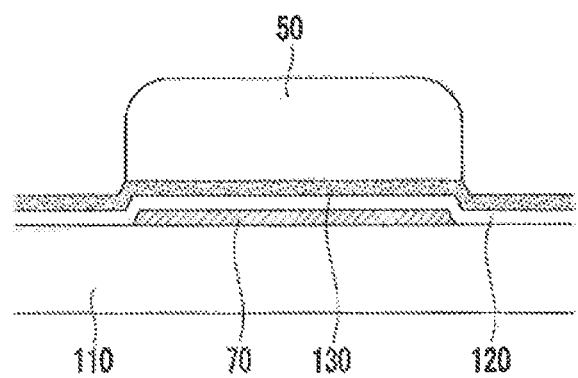
Figure 5:
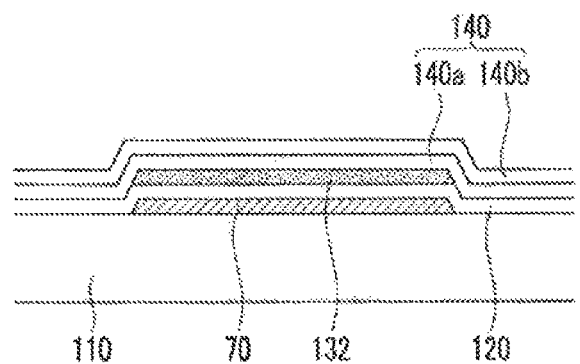
Figure 6:
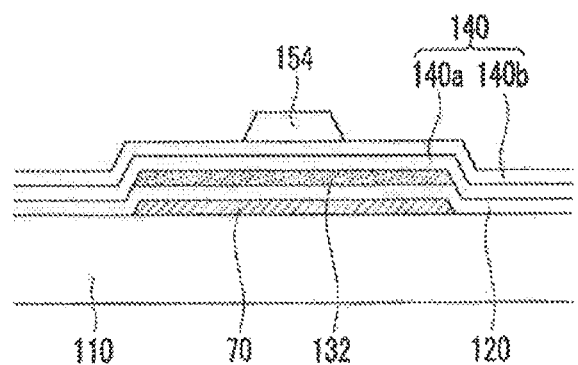
Figure 7:
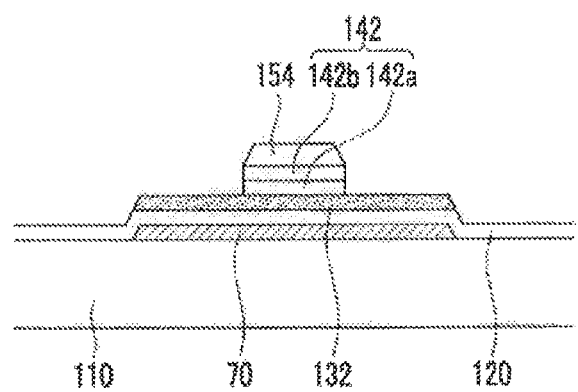
Figure 8:
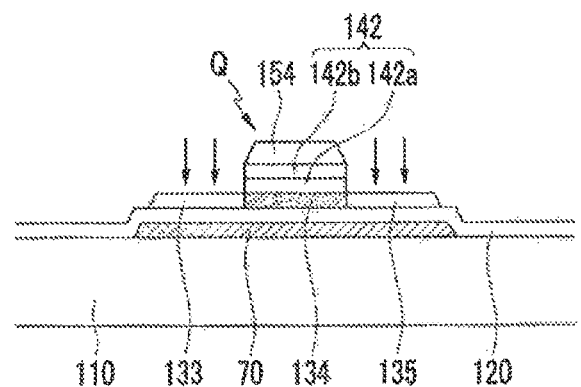
Figure 9:
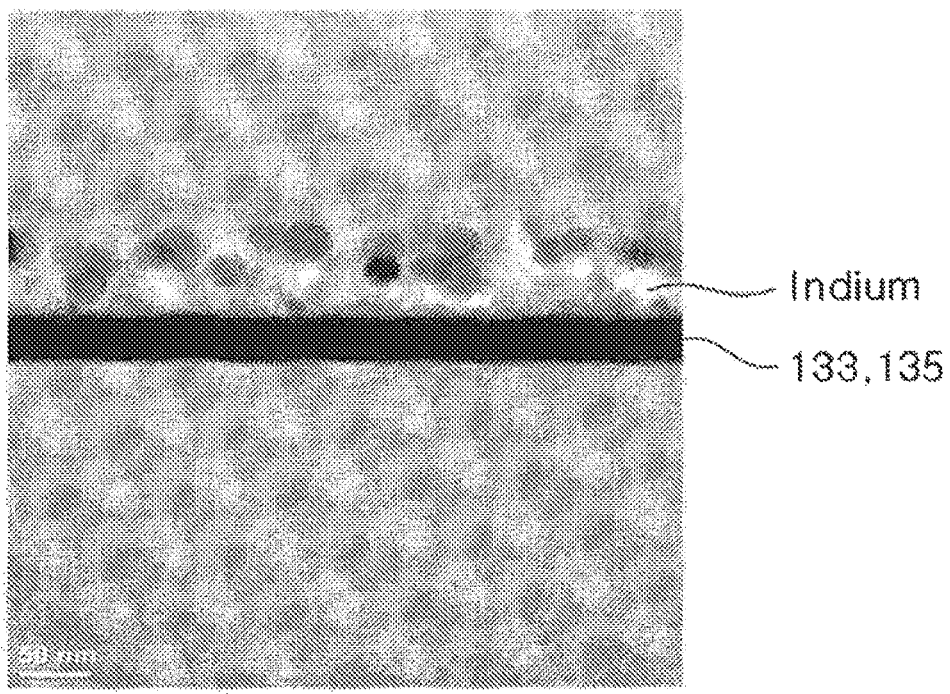
Figure 10:
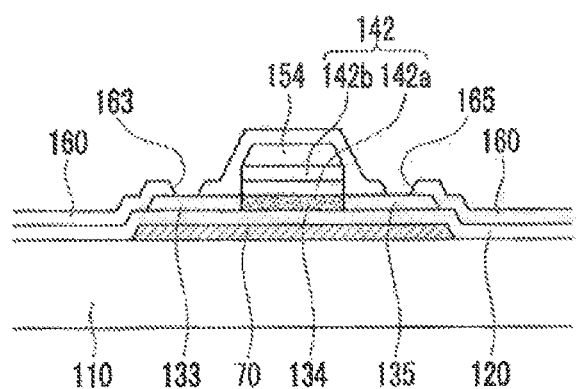
Figure 11:
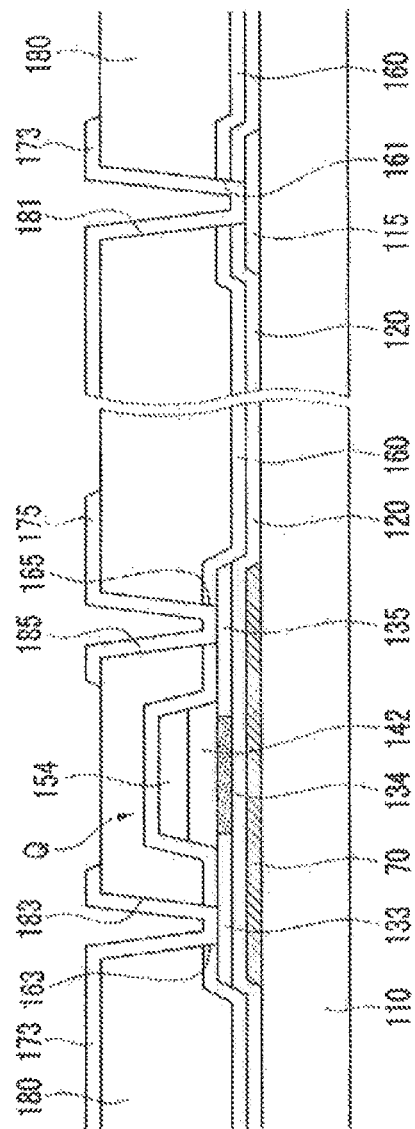
FIG. 11 is a cross-sectional view illustrating a thin film transistor array panel including a thin film transistor according to an exemplary embodiment of the present invention.
Figure 12:
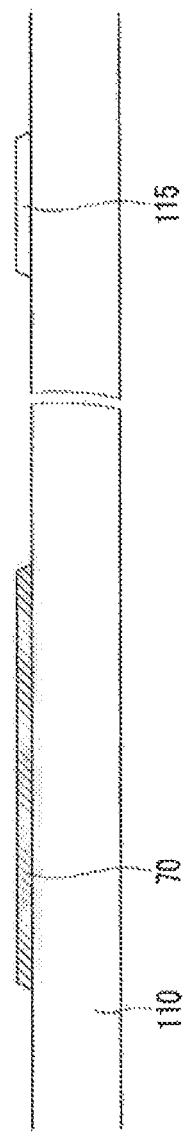
FIG. 12, FIG. 13, FIG. 14, FIG. 15, FIG. 16, FIG. 17, FIG. 18, FIG. 19, and FIG. 20 are cross-sectional views sequentially showing a method of manufacturing the thin film transistor array panel shown in FIG. 11 according to an exemplary embodiment of the present invention.
Figure 13:
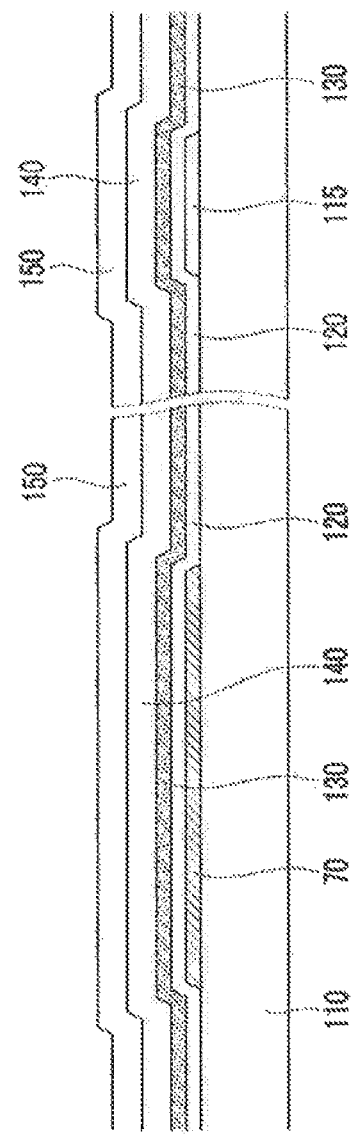
Figure 14:
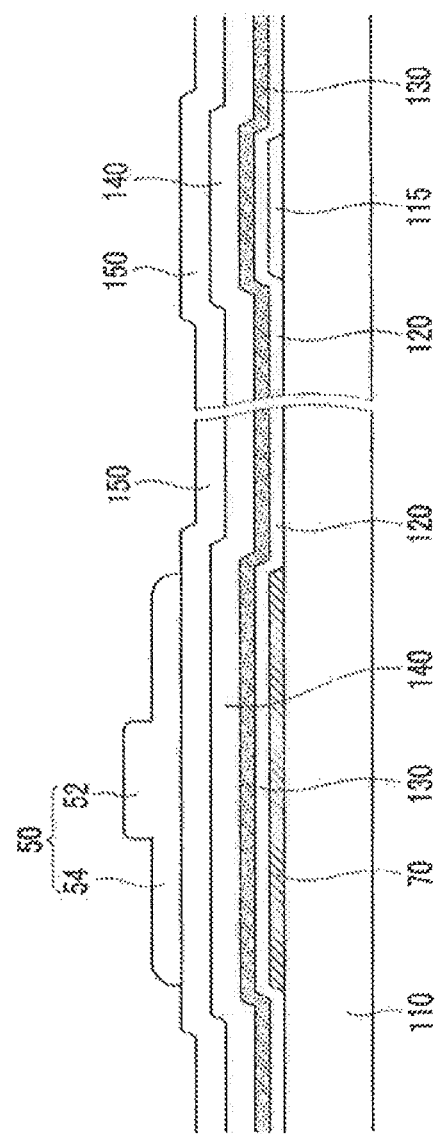
Figure 15:
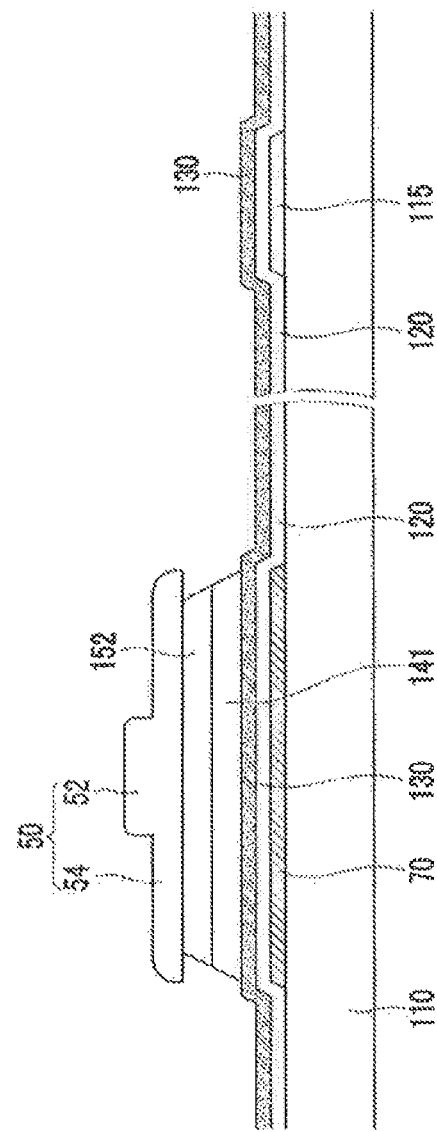
Figure 16:
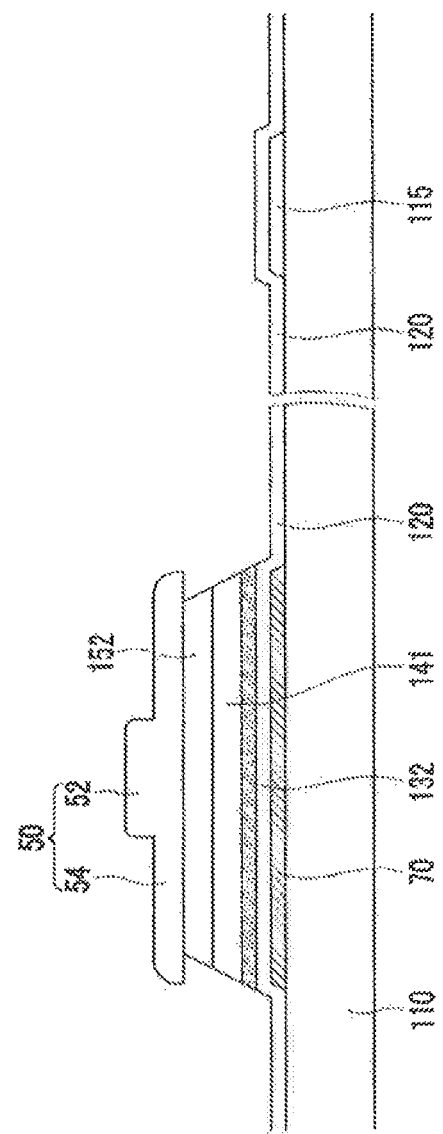
Figure 17:
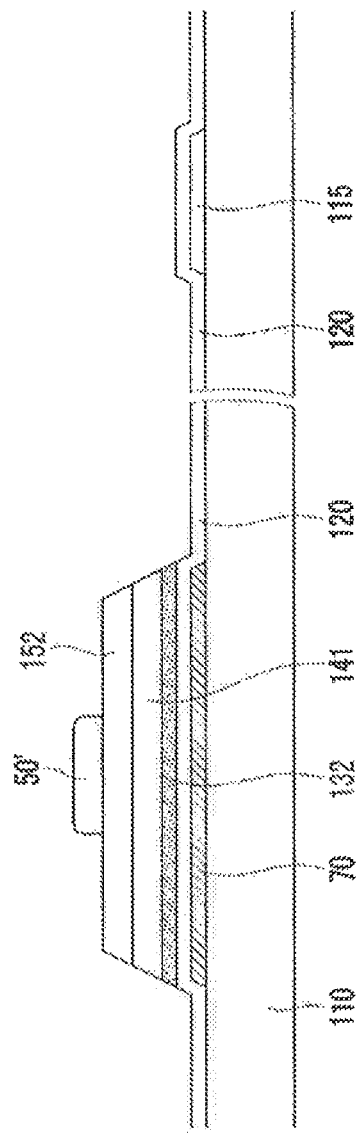
Figure 18:
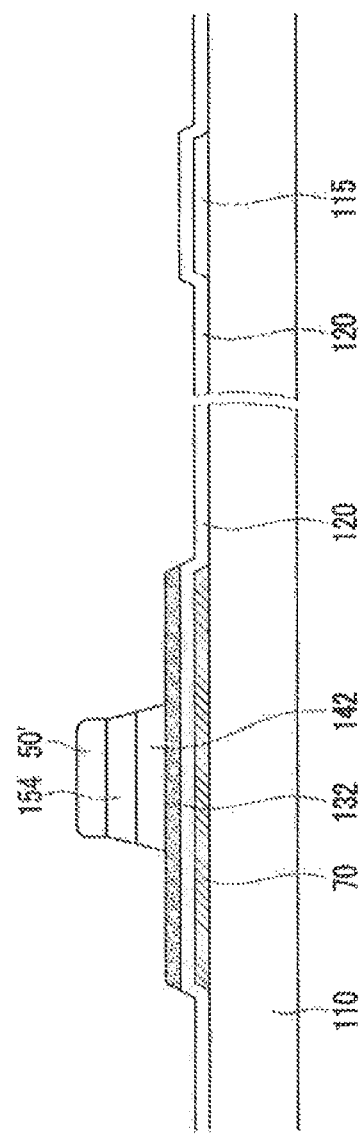
Figure 19:
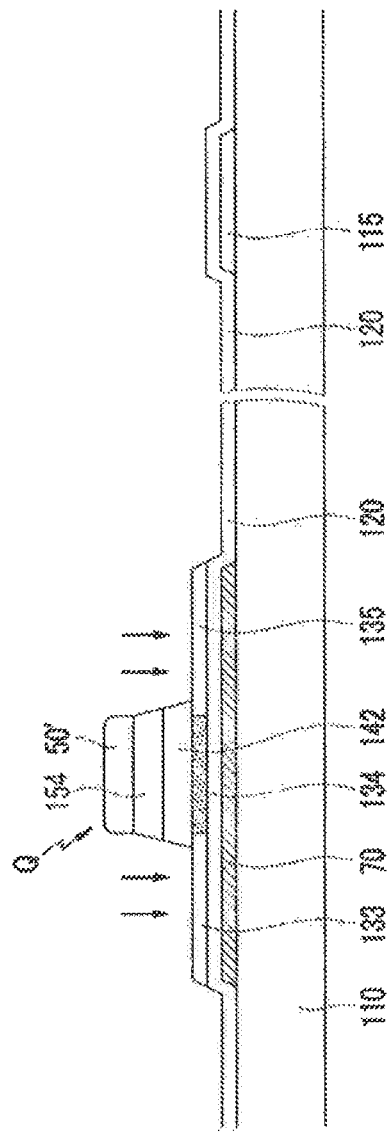
Figure 20:
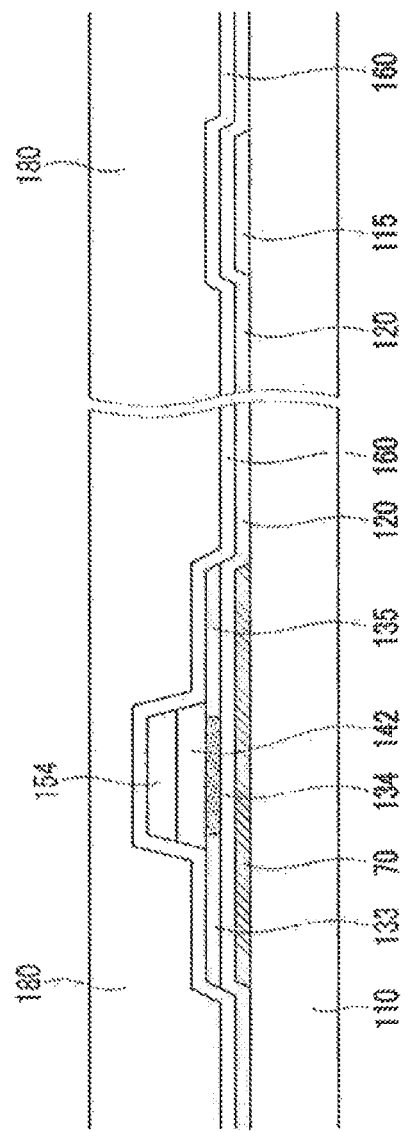
Figure 21:
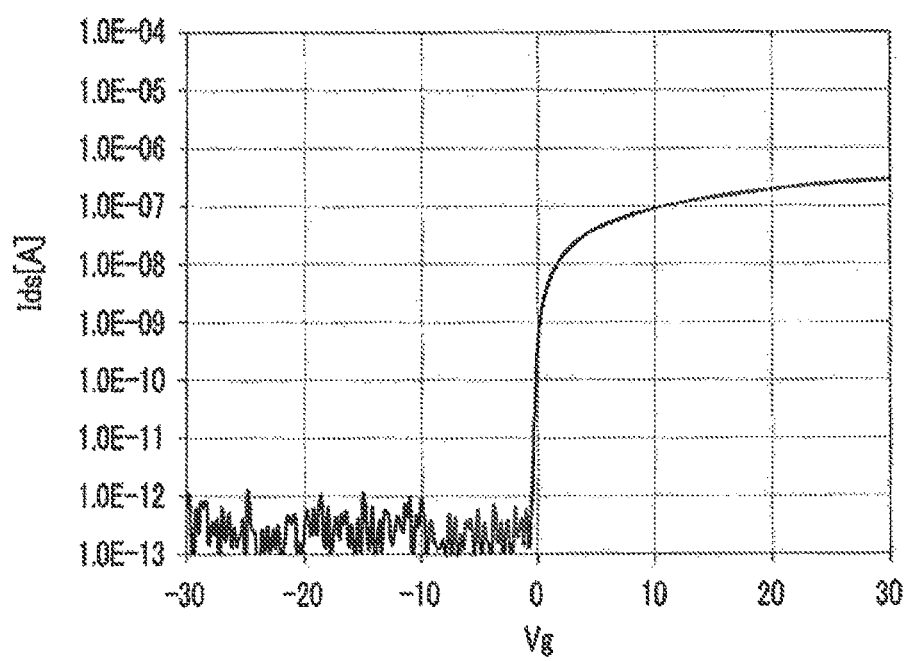
FIG. 21 is a graph illustrating a voltage-current characteristic of a thin film transistor according to an exemplary embodiment of the present invention.
Figure 22:
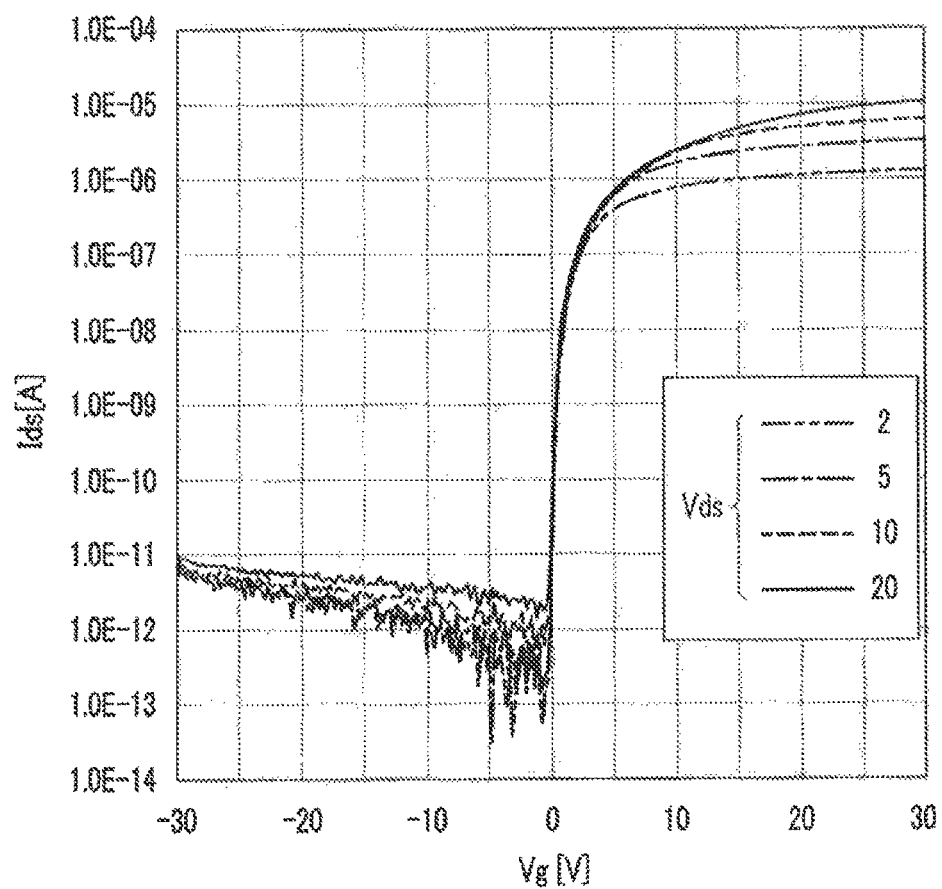
FIG. 22 is a graph illustrating a voltage-current characteristic according to various source-drain voltages of a thin film transistor according to an exemplary embodiment of the present invention.

FIG. 1A is a cross-sectional view illustrating a thin film transistor array panel including a thin film transistor according to an exemplary embodiment of the present invention, and FIG. 1B is a plan view of the thin film transistor array panel of FIG. 1A. Referring to FIG. 1A, a light blocking film 70 is positioned on an insulation substrate 110 made of glass or plastic. The light blocking film 70 prevents or inhibits light from reaching an oxide semiconductor included in a channel region to thereby prevent the oxide semiconductor from losing its characteristics. According to an embodiment, the light blocking film 70 is made of a material that does not transmit light of a predetermined wavelength band so that light does not reach the oxide semiconductor. According to an embodiment, the light blocking film 70 is made of an organic insulating material, an inorganic insulating material, or a conductive material, such as a metal, and according to an embodiment, includes a single layer or multiple layers. According to an embodiment, the light blocking film 70 is omitted. For example, when there is no light radiation from under the insulation substrate 110, for example, when the thin film transistor according to an exemplary embodiment of the present invention is used for an organic light emitting device, the light blocking film 70 is omitted. A buffer layer 120 is positioned on the light blocking film 70. According to an embodiment, the buffer layer 120 includes an insulating oxide, such as silicon oxide (SiOx), aluminum oxide ($Al_2O_3$), hafnium oxide ($HfO_3$), and yttrium oxide ($Y_2O_3$). The buffer layer 120 prevents an impurity from the insulation substrate 110 from flowing into a semiconductor to be deposited later, protecting the semiconductor and improving interface characteristics of the semiconductor. A thickness of the buffer layer 120 is in a range of more than about 500 μm to less than about 1 μm, but is not limited thereto. A semiconductor layer including a channel region 134, a source region 133, and a drain region 135 is formed on the buffer layer 120. The semiconductor layer includes an oxide semiconductor material. The oxide semiconductor material includes a metal oxide semiconductor made of a metal oxide of zinc (Zn), indium (In), gallium (Ga), tin (Sn), or titanium (Ti), or a combination of the metal of zinc (Zn), indium (In), gallium (Ga), tin (Sn), titanium (Ti), and the metal oxide thereof. For example, according to an embodiment, the oxide semiconductor material includes at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). The channel region 134 overlaps the light blocking film 70. Referring to FIGS. 1A and 1B, the source region 133 and the drain region 135 are respectively positioned at two sides of the channel region 134 and are separated from each other. The source region 133 and the drain region 135 are connected to the channel region 134. The source region 133 and the drain region 135 have conductivity and include a semiconductor material forming the channel region 134 and a reduced semiconductor material of the channel region 134. A metal, such as indium (In), included in the semiconductor material may be extracted to a surface of at least one of the source region 133 and the drain region 135. An insulating layer 142 is positioned on the channel region 134. The insulating layer 142 covers the channel region 134. The insulating layer 142 does not overlap or substantially does not overlap the source region 133 or the drain region 135. According to an embodiment, the insulating layer 142 includes a single-layered structure or a multilayered structure having at least two layers. When the insulating layer 142 includes a single-layered structure, the insulating layer 142 includes an insulating oxide, such as silicon oxide (SiOx), aluminum oxide ($Al_2O_3$), hafnium oxide ($HfO_3$), and yttrium oxide ($Y_2O_3$). The insulating layer 142 improves interface characteristics of the channel region 134 and prevents an impurity from penetrating into the channel region 134. When the insulating layer 142 includes a multilayered structure, the insulating layer 142 includes a lower layer 142a and an upper layer 142b as shown in FIG. 1A. The lower layer 142a includes an insulating oxide, such as silicon oxide (SiOx), aluminum oxide ($Al_2O_3$), hafnium oxide ($HfO_3$), and yttrium oxide ($Y_2O_3$), such that the interface characteristic of the channel region 134 may be improved and the penetration of the impurity into the channel region 134 may be prevented. According to an embodiment, the upper layer 142b is made of various insulating materials, such as silicon nitride (SiNx) and silicon oxide (SiOx). For example, according to an embodiment, the insulating layer 142 includes a lower layer of aluminum oxide (AlOx), which has, but is not limited to, a thickness of less than about 500 Å, and an upper layer of silicon oxide (SiOx), which has, but is not limited to, a thickness of more than about 500 Å to less than about 1500 Å. Alternatively, the insulating layer 142 includes a lower layer of silicon oxide (SiOx), which has, but is not limited to, a thickness of about 2000 Å, and an upper layer of silicon nitride (SiNx), which has, but is not limited to, a thickness of about 1000 Å. According to an embodiment, a thickness of the insulating layer 142 is more than 1000 Å to less than 5000 Å, but is not limited thereto. An entire thickness of the insulating layer 142 is controlled to maximize the characteristics of the thin film transistor. A gate electrode 154 is positioned on the insulating layer 142. An edge of the gate electrode 154 and an edge of the insulating layer 142 are aligned or substantially aligned with each other. Referring to FIGS. 1A and 1B, the gate electrode 154 includes a portion overlapping the channel region 134, and the channel region 134 is covered by the gate electrode 154. The source region 133 and the drain region 135 are positioned at two sides of the channel region 134 with respect to the gate electrode 154, and the source region 133 and the drain region 135 do not overlap or do not substantially overlap the gate electrode 154. Accordingly, the parasitic capacitance between the gate electrode 154 and the source region 133 or the parasitic capacitance between the gate electrode 154 and the drain region 135 may be decreased. According to an embodiment, the gate electrode 154 is made of a metal, such as aluminum (Al), silver (Ag), copper (Cu), molybdenum (Mo), chromium (Cr), tantalum (Ta), and titanium (Ti), or alloys thereof. The gate electrode 154 has a single-layered or multilayered structure. According to an embodiment, the multilayered structure includes a double-layered structure including a lower layer of titanium (Ti), tantalum (Ta), molybdenum (Mo), or ITO and an upper layer of copper (Cu). According to an embodiment, when the gate electrode includes a multilayered structure, the gate electrode includes a triple-layered structure of molybdenum (Mo)-aluminum (Al)-molybdenum (Mo). According to an embodiment, the gate electrode 154 is made of various metals or conductors. According to an exemplary embodiment of the present invention, a boundary between the channel region 134 and the source region 133 or a boundary between the channel region 134 and the drain region 135 are aligned or substantially aligned with an edge of the gate electrode 154 or the insulating layer 142. Alternatively, the boundary between the channel region 134 and the source region 133 or the drain region 135 is positioned more inwardly with respect to the edge of the gate electrode 154 or the insulating layer 142. The gate electrode 154, the source region 133, and the drain region 135 form a thin film transistor (TFT) Q along with the channel region 134, and a channel of the thin film transistor is formed in the channel region 134. A passivation layer 160 is positioned on the gate electrode 154, the source region 133, the drain region 135, and the buffer layer 120. According to an embodiment, the passivation layer 160 is made of an inorganic insulating material, such as silicon nitride or silicon oxide, or an organic insulating material. The passivation layer 160 has a contact hole 163 exposing the source region 133 and a contact hole 165 exposing the drain region 135. A data input electrode 173 and a data output electrode 175 are positioned on the passivation layer 160. The data input electrode 173 is also referred to as a source electrode, and the data output electrode 175 is also referred to as a drain electrode The data input electrode 173 is electrically connected to the source region 133 of the thin film transistor Q through the contact hole 163 of the passivation layer 160, and the data output electrode 175 is electrically connected to the drain region 135 of the thin film transistor Q through the contact hole 165 of the passivation layer 160. Alternatively, a color filter (not shown) or an organic layer (not shown) made of an organic material is further positioned on the passivation layer 160, and the data input electrode 173 and the data output electrode 175 are positioned on the color filter or organic layer. Alternatively, at least one of the data input electrode 173 and the data output electrode 175 is omitted. A method of manufacturing the thin film transistor array panel shown in FIG. 1 according to an exemplary embodiment of the present invention is described with reference to FIG. 2 to FIG. 9 as well as FIG. 1. FIG. 2, FIG. 3, FIG. 4, FIG. 5, FIG. 6, FIG. 7, FIG. 8, FIG. 9, and FIG. 10 are cross-sectional views sequentially showing a method of manufacturing the thin film transistor array panel shown in FIG. 1 according to an exemplary embodiment of the present invention. Referring to FIG. 2, the light blocking film 70 made of an organic insulating material, an inorganic insulating material, or a conductive material, such as a metal, is formed on the insulation substrate 110 made of glass or plastic. According to an embodiment, the forming of the light blocking film 70 is omitted according to the condition. Referring to FIG. 3, the buffer layer 120 made of an insulating material including an oxide, such as silicon oxide (SiOx), aluminum oxide ($Al_2O_3$), hafnium oxide ($HfO_3$), and yttrium oxide ($Y_2O_3$), is formed on the light blocking film 70 by a chemical vapor deposition (CVD) method. A thickness of the buffer layer 120 is in a range more than about 500 μm to less than about 1 μm, but is not limited thereto. Referring to FIG. 4, a semiconductor material layer 130 made of an oxide semiconductor material, such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), is coated on the buffer layer 120. A photosensitive film including a photoresist is coated on the semiconductor material layer 130 and is exposed to light, resulting in a photosensitive film pattern 50. The photosensitive film pattern 50 overlaps at least a portion of the light blocking film 70. Referring to FIG. 5, the semiconductor material layer 130 is etched by using the photosensitive film pattern 50 as a mask to form a semiconductor pattern 132. An insulating material layer 140 is formed on the semiconductor pattern 132 and the buffer layer 120. The insulating material layer 140 includes a single-layered structure including an insulating oxide of silicon oxide (SiOx), or as shown in FIG. 5, includes a multilayered structure including a lower layer 140a including an insulating oxide, such as silicon oxide (SiOx), and an upper layer 140b including an insulating material. A thickness of the insulating material layer 140 is more than about 1000 Å to less than about 5000 Å, but is not limited thereto. Referring to FIG. 6, a conductive material, such as a metal, is deposited on the insulating material layer 140 and is patterned to form the gate electrode 154. The gate electrode 154 is formed to traverse a center portion of the semiconductor pattern 132 such that two portions of the semiconductor pattern 132 respectively positioned at two sides of the overlapping portion of the gate electrode 154 and the semiconductor pattern 132 are not covered by the gate electrode 154. Referring to FIG. 7, the insulating material layer 140 is patterned by using the gate electrode 154 as an etching mask to form the insulating layer 142. According to an embodiment, the insulating layer 142 includes a single-layered structure or a multilayered structure that includes a lower layer 142a including an insulating oxide and an upper layer 142b including an insulating material. Accordingly, the gate electrode 154 and the insulating layer 142 have the same or substantially the same plane shape. The two portions of the semiconductor pattern 132 that are not covered by the gate electrode 154 are exposed. According to an embodiment, the method of patterning the insulating material layer 140 includes a dry etching method in which etching gas and etching time are controlled for the buffer layer 120 to not be etched. Referring to FIG. 8, the two exposed portions of the semiconductor pattern 132 are subjected to a reduction treatment method, thereby forming the source region 133 and the drain region 135 having conductivity. The semiconductor pattern 132 that is covered by the insulating layer 142 and is not reduced becomes a channel region 134. Accordingly, the gate electrode 154, the source region 133, and the drain region 135 form the thin film transistor Q along with the channel region 134. According to an embodiment, the reduction treatment method includes a heat treatment method that is performed in a reduction atmosphere and a gas plasma treatment using plasma, such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), and fluoroform ($CHF_3$). At least a portion of the semiconductor material forming the reduced and exposed semiconductor pattern 132 has only metallic bonding. Accordingly, the reduced semiconductor pattern 132 has conductivity. In the reduction treatment of the semiconductor pattern 132, the metallic component of the semiconductor material, for example indium (In), is extracted to a surface of the semiconductor pattern 132. A thickness of the extracted metal layer is less than about 200 nm. FIG. 9 shows an example of indium (In) particles extracted to the surface of the source region 133 and the drain region 135 when the semiconductor material forming the semiconductor pattern 132 includes indium (In). According to an exemplary embodiment of the present invention, a boundary between the channel region 134 and the source region 133 or a boundary between the channel region 134 and the drain region 135 is aligned or substantially aligned with an edge of the gate electrode 154 or the insulating layer 142. However, in the reduction treatment of the semiconductor pattern 132, a portion of the semiconductor pattern 132 under the edge portion of the insulating layer 142 may be reduced such that the boundary between the channel region 134 and the source region 133 or the drain region 135 may be positioned more inwardly with respect to the edge of the gate electrode 154 or the insulating layer 142. Referring to FIG. 10, an insulating material is coated on the gate electrode 154, the source region 133, the drain region 135, and the buffer layer 120, thus forming the passivation layer 160. The passivation layer 160 is patterned to form a contact hole 163 exposing the source region 133 and a contact hole 165 exposing the drain region 135. As shown in FIG. 1, a data input electrode 173 and a data output electrode 175 are formed on the passivation layer 160. In the thin film transistor Q according to an exemplary embodiment of the present invention, the gate electrode 154 and the source region 133 or the gate electrode 154 and the drain region 135 do not overlap or substantially do not overlap each other such that the parasitic capacitance between the gate electrode 154 and the source region 133 or between the gate electrode 154 and the drain region 135 may be decreased. Accordingly, the on/off characteristics of the thin film transistor Q as a switching element may be improved. Referring to FIG. 11, a thin film transistor and a thin film transistor array panel according to an exemplary embodiment of the present invention are described. FIG. 11 is a cross-sectional view including a thin film transistor array panel including a thin film transistor according to an exemplary embodiment of the present invention. Referring to FIG. 11, a light blocking film 70 is positioned on an insulation substrate 110. The light blocking film 70 prevents light from reaching a semiconductor included in the channel region 134 such that the semiconductor does not lose its characteristics. According to an embodiment, the light blocking film 70 is made of a material that does not transmit light of a predetermined wavelength band so that light does not reach the semiconductor. According to an embodiment, the light blocking film 70 is made of an organic insulating material, an inorganic insulating material, or a conductive material, such as a metal, and according to an embodiment, includes a single layer or multiple layers. A data line 115 through which a data signal is transmitted is positioned on the insulation substrate 110. According to an embodiment, the data line 115 is made of a conductive material including metal, such as, e.g., aluminum (Al), silver (Ag), copper (Cu), molybdenum (Mo), chromium (Cr), tantalum (Ta), and titanium (Ti), or alloys thereof. A buffer layer 120 is positioned on the light blocking film 70 and the data line 115. A semiconductor layer including a channel region 134, a source region 133, and a drain region 135 is formed on the buffer layer 120. The channel region 134 includes an oxide semiconductor material. When the light blocking film 70 is provided, the channel region 134 overlaps the light blocking film 70. The source region 133 and the drain region 135 are positioned at two sides of the channel region 134. The source region 133 and the drain region 135 face each other and are separated from each other with the channel region 134 positioned between the source region 133 and the drain region 135. The source region 133 and the drain region 135 are connected to the channel region 134. An insulating layer 142 is positioned on the channel region 134. The insulating layer 142 covers the channel region 134. According to an embodiment, the insulating layer 142 does not overlap or substantially does not overlap the source region 133 or the drain region 135. According to an embodiment, the insulating layer 142 has a single-layered structure or a multilayered structure. For example, according to an embodiment, the insulating layer 142 includes a single layer including a material, such as silicon oxide (SiOx) or silicon nitride (SiNx), or includes a lower layer of aluminum oxide ($Al_2O_3$) and an upper layer of silicon oxide (SiOx). According to an embodiment, the insulating layer 142 has the characteristics of the insulating layer 142 described in connection with FIGS. 1 to 10. A gate electrode 154 is positioned on the insulating layer 142. An edge of the gate electrode 154 and an edge of the insulating layer 142 are aligned or substantially aligned with each other. The gate electrode 154 includes a portion overlapping the channel region 134, and the channel region 134 is covered by the gate electrode 154. The source region 133 and the drain region 135 are positioned at two sides of the channel region 134 with respect to the gate electrode 154, and the source region 133 and the drain region 135 do not overlap or do not substantially overlap the gate electrode 154. Accordingly, the parasitic capacitance between the gate electrode 154 and the source region 133 or the parasitic capacitance between the gate electrode 154 and the drain region 135 may be decreased. The gate electrode 154, the source region 133, and the drain region 135 form the thin film transistor Q along with the channel region 134. A passivation layer 160 is positioned on the gate electrode 154, the source region 133, the drain region 135, and the buffer layer 120. The passivation layer 160 has a contact hole 163 exposing the source region 133 and a contact hole 165 exposing the drain region 135. The buffer layer 120 and the passivation layer 160 include a contact hole 161 exposing the data line 115. An organic layer 180 is further positioned on the passivation layer 160. The organic layer 180 includes an organic insulating material or a color filter material. The organic layer 180 has a flat surface. The organic layer 180 includes a contact hole 183, which exposes the source region 133 and corresponds to the contact hole 163 of the passivation layer 160, a contact hole 185, which exposes the drain region 135 and corresponds to the contact hole 165 of the passivation layer 160, and a contact hole 181 which exposes the data line 115 and corresponds to the contact hole 161 of the passivation layer 160 and the buffer layer 120. As shown in FIG. 11, edges of the contact holes 183, 185, and 181 of the organic layer 180 are respectively aligned with edges of the contact holes 163, 165, and 161 of the passivation layer 160. Alternatively, the edges of the contact holes 163, 165, and 161 of the passivation layer 160 are respectively positioned in a further inward position than the edges of the contact holes 183, 185, and 181 of the organic layer 180. For example, the contact holes 163, 165, and 161 of the passivation layer 160 are respectively positioned within the contact holes 183, 185, and 181 of the organic layer 180 when seen in plan view. A data input electrode 173, also referred to as a source electrode, and a data output electrode 175, also referred to as a drain electrode, are disposed on the organic layer 180. The data input electrode 173 is electrically connected to the source region 133 of the thin film transistor Q through the contact hole 163 of the passivation layer 160 and the contact hole 183 of the organic layer 180, and the data output electrode 175 is electrically connected to the drain region 135 of the thin film transistor Q through the contact hole 165 of the passivation layer 160 and the contact hole 185 of the organic layer 180. The data input electrode 173 is connected to the data line 115 through the contact hole 161 of the passivation layer 160 and the contact hole 181 of the organic layer 180. Accordingly, the source region 133 receives a data signal from the data line 115. According to an embodiment, the data output electrode 175 forms a pixel electrode that is used to control image display or the data output electrode 175 is connected to a separate pixel electrode (not shown). A method of manufacturing the thin film transistor array panel shown in FIG. 11 according to an exemplary embodiment of the present invention is described with reference to FIG. 12 to FIG. 20 as well as FIG. 11. FIG. 12, FIG. 13, FIG. 14, FIG. 15, FIG. 16, FIG. 17, FIG. 18, FIG. 19 and FIG. 20 are cross-sectional views sequentially showing a method of manufacturing the thin film transistor array panel shown in FIG. 11 according to an exemplary embodiment of the present invention, Referring to FIG. 12, a light blocking film 70 made of an organic insulating material, an inorganic insulating material, or a conductive material, such as a metal, is formed on an insulation substrate 110 of glass or plastic. According to an embodiment, the formation of the light blocking film 70 is omitted according to the condition. A metal is deposited and patterned on the insulation substrate 110 to thereby form a data line 115. According to an embodiment, the sequence of forming the light blocking film 70 and the data line 115 is changed. For example, the data line 115 is formed, and the light blocking film 70 is then formed. Referring to FIG. 13, a buffer layer 120, a semiconductor material layer 130, an insulating material layer 140, and a gate layer 150 are sequentially deposited on the light blocking film 70 and the data line 115. The buffer layer 120 is formed by depositing an insulating oxide, such as silicon oxide (SiOx), aluminum oxide ($Al_2O_3$), hafnium oxide ($HfO_3$), and yttrium oxide ($Y_2O_3$). A thickness of the buffer layer 120 is in a range from more than about 500 μm to less than about 1 pm, but is not limited thereto. The semiconductor material layer 130 is formed by depositing an oxide semiconductor material, such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). The insulating material layer 140 is formed of an insulating material including an insulating oxide, such as silicon oxide (SiOx). According to an embodiment, the insulating material layer 140 includes a single-layered structure or a multilayered structure including a lower layer 140a including an oxide, such as silicon oxide (SiOx), and an upper layer 140b including an insulating material. A thickness of the insulating material layer 140 is in a range from more than about 1000 Å to less than about 5000 Å, but is not limited thereto. The gate layer 150 is formed by depositing a conductive material, such as aluminum (Al). Referring to FIG. 14, a photosensitive film of a photoresist is coated on the gate layer 150 and is exposed to light, thereby forming the photosensitive film pattern 50. The photosensitive film pattern 50 includes, as shown in FIG. 14, a first portion 52 having a relatively large thickness and a second portion 54 having a relatively small thickness. The first portion 52 of the photosensitive film pattern 50 overlaps the light blocking film 70. Two sides of the second portion 54, which are separated and face each other with respect to the first portion 52, are respectively connected to two sides of the first portion 52 of the photosensitive film pattern 50. The photosensitive film pattern 50 is formed by an exposing process using a photomask (not shown) including a transflective region. For example, the photomask for forming the photosensitive film pattern 50 includes a transmission region that transmits light, a light blocking region that blocks light, and a transflective region that transmits part of light. According to an embodiment, the transflective region is formed of a slit or a translucent layer. When the exposing process is performed by using the photomask including the transflective region and using a negative photosensitive film, a portion corresponding to the transmission region of the photomask is irradiated with light such that the photosensitive film remains thereby forming the first portion 52 having a relatively large thickness, a portion corresponding to the light blocking region of the photomask is blocked from light irradiation such that the photosensitive film is removed, and a portion corresponding to the transflective region of the photomask is partially irradiated with light such that the second portion 54 having a relatively small thickness is formed. When a positive photosensitive film is used for the exposing process, a portion corresponding to the transmission region of the photomask is irradiated with light such that the photosensitive film is removed, a portion corresponding to the light blocking region of the photomask is blocked from light irradiation such that the photosensitive film remains thereby forming the first portion 52 having a relatively large thickness, and a portion corresponding to the transflective region of the photomask is partially irradiated with light such that the second portion 54 having a relatively small thickness is formed. As such, irrespective of whether a negative photosensitive film or positive photosensitive film is used for the exposing process, the portion corresponding to the transflective region of the photomask is subjected to partial light irradiation, thus resulting in the second portion 54 of the photosensitive film pattern 50. Referring to FIG. 15, the gate layer 150 and the insulating material layer 140 are sequentially etched by using the photosensitive film pattern 50 as an etching mask. According to an embodiment, the gate layer 150 is etched through a wet etching method, and the insulating material layer 140 is etched through a dry etching method. Accordingly, the gate pattern 152 and the insulating pattern 141 having the same plane shape are formed under the photosensitive film pattern 50. The semiconductor material layer 130 that is not covered by the photosensitive film pattern 50 is exposed. Referring to FIG. 16, the exposed semiconductor material layer 130 is removed by using the gate pattern 152 and the insulating pattern 141 as an etching mask to thereby form a semiconductor pattern 132. The semiconductor pattern 132 has the same plane shape as the gate pattern 152 and the insulating pattern 141. Referring to FIG. 17, the photosensitive film pattern 50 is etched through an ashing method using oxygen plasma so that the second portion 54 is removed and a thickness of the photosensitive film pattern 50 is reduced. Accordingly, the first portion 52 with the reduced thickness remains thereby resulting in a photosensitive film pattern 50'. Referring to FIG. 18, the gate pattern 152 and the insulating pattern 141 are sequentially etched by using the photosensitive film pattern 50' as an etching mask. Accordingly, the semiconductor pattern 132 that is not covered by the photosensitive film pattern 50' is exposed. The exposed semiconductor pattern 132 is positioned at two sides of the semiconductor pattern 132 that is covered by the photosensitive film pattern 50'. Referring to FIG. 19, the semiconductor pattern 132 undergoes a reduction treatment to thereby form the source region 133 and the drain region 135 having conductivity. The semiconductor pattern 132 covered by the insulating layer 142 is not reduced thereby forming the channel region 134. The gate electrode 154, the source region 133, and the drain region 135 form the thin film transistor Q along with the channel region 134. According to an embodiment, the reduction treatment method includes a heat treatment method that is performed in a reduction atmosphere and a gas plasma treatment using plasma, such as hydrogen ($H_2$), argon (Ar), nitrogen ($N_2$), nitrogen oxide ($N_2O$), and fluoroform ($CHF_3$). At least a portion of the semiconductor material forming the reduced and exposed semiconductor pattern 132 has only metallic bonding. Accordingly, the reduced semiconductor pattern 132 has conductivity. In the reduction treatment of the semiconductor pattern 132, the metallic component of the semiconductor material, for example indium (In), is extracted to a surface of the semiconductor pattern 132. A thickness of the extracted metal layer is less than about 200 nm. According to an exemplary embodiment of the present invention, a boundary between the channel region 134 and the source region 133 or a boundary between the channel region 134 and the drain region 135 is aligned or substantially aligned with an edge of the gate electrode 154 or the insulating layer 142. However, in the reduction treatment of the semiconductor pattern 132, a portion of the semiconductor pattern 132 under the edge portion of the insulating layer 142 may be reduced such that the boundary between the channel region 134 and the source region 133 or the drain region 135 may be positioned more inwardly with respect to the edge of the gate electrode 154 or the insulating layer 142. Referring to FIG. 20, after removing the photosensitive film pattern 50', an insulating material is coated on the gate electrode 154, the source region 133, the drain region 135, and the buffer layer 120 to thereby form a passivation layer 160. An organic insulating material is coated on the passivation layer 160, thus forming the organic layer 180. As shown in FIG. 11, contact holes 163, 165, 161, 183, 185, and 181 are formed in the passivation layer 160 and the organic layer 180, and a data input electrode 173 and a data output electrode 175 are formed on the organic layer 180. When forming the contact holes 163, 165, 161, 183, 185, and 181 in the passivation layer 160 and the organic layer 180, one or two masks are used. For example, the organic layer 180 is exposed by using one photomask to form the contact holes 183, 185, and 181 of the organic layer 180, and then contact holes 163, 165, and 161 of the passivation layer 160 are formed that, when viewed in plan view, are respectively positioned within the contact holes 183, 185, and 181 of the organic layer 180 by using another photomask. Edges of the contact holes 163, 165, and 161 of the passivation layer 160 are respectively aligned with edges of the contact holes 183, 185, and 181 of the organic layer 180. FIG. 21 is a graph illustrating a voltage-current characteristic of a thin film transistor according to an exemplary embodiment of the present invention, and FIG. 22 is a graph illustrating a voltage-current characteristic according to various source-drain voltages of a thin film transistor according to an exemplary embodiment of the present invention. Referring to FIG. 21, an on/off transition of the source-drain current (Ids) according to the gate electrode voltage (Vg) in a thin film transistor Q according to an exemplary embodiment of the present invention is distinctly identified at a threshold voltage, and an ON current is relatively high, which means that the characteristics of the thin film transistor Q as a switching element are improved. Referring to FIG. 22, a thin film transistor Q according to an exemplary embodiment of the present invention experiences no or little change in the threshold voltage according to a change in the source-drain voltage (Vds), such that the thin film transistor Q may maintain uniform characteristics as a switching element. As described above, according to the exemplary embodiments of the present invention, the gate electrode 154 and the source region 133 of the thin film transistor Q or the gate electrode 154 and the drain region 135 of the thin film transistor Q do not overlap or substantially do not overlap each other such that the parasitic capacitance between the gate electrode 154 and the source region 133 or the parasitic capacitance between the gate electrode 154 and the drain region 135 may be decreased. Accordingly, the ON current and the mobility of the thin film transistor may be increased and the on/off characteristics of the thin film transistor Q as a switching element may be improved. As a result, a display device with the thin film transistor may have a reduced RC delay. Accordingly, the thickness of the driving signal lines may be decreased, thus resulting in savings in manufacturing costs. Further, the characteristics of the thin film transistor itself are improved, resulting in a reduced size of the thin film transistor and an increased margin for forming a minute channel.

Figure 23A:
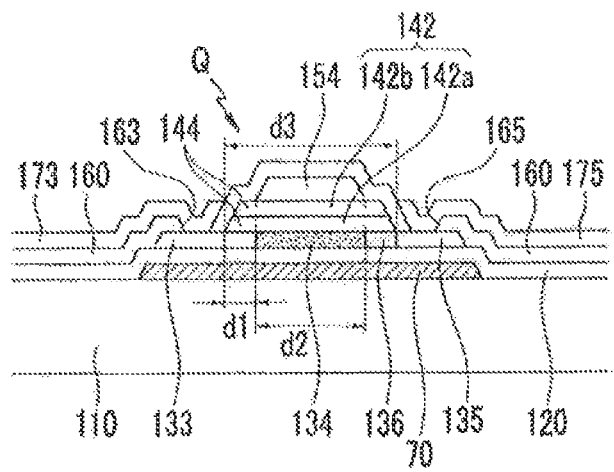
FIG. 23A is a cross-sectional view illustrating a thin film transistor array panel including a thin film transistor according to an exemplary embodiment of the present invention.
Figure 23B:
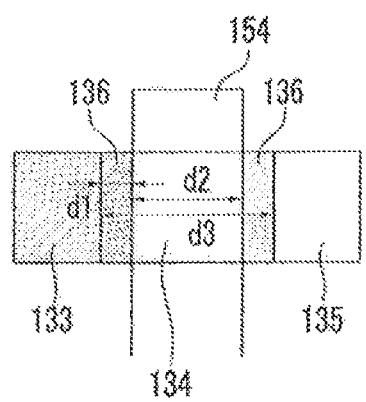
FIG. 23B is a plan view of the thin film transistor array panel of FIG. 23A.

FIG. 23A is a cross-sectional view illustrating a thin film transistor array panel including a thin film transistor according to an exemplary embodiment of the present invention, and FIG. 23B is a plan view illustrating a thin film transistor array panel as shown in FIG. 23A, according to an exemplary embodiment of the present invention.

Referring to FIG. 23A, a light blocking film 70 may be positioned on an insulation substrate 110 made of glass or plastic. The light blocking film 70 prevents light from reaching an oxide semiconductor that is to be deposited later, thus preventing characteristics of the oxide semiconductor from being lost. The light blocking film 70 is made of a material that does not transmit light of a wavelength band to reach the oxide semiconductor. The light blocking film 70 may be made of an organic insulating material, an inorganic insulating material, or a conductive material such as a metal, and the light blocking film 70 may include a single layer or multiple layers.

However, the light blocking film 70 may be omitted according to a condition. For example, when light is not radiated to a place under the insulation substrate 110, for example when the thin film transistor according to an exemplary embodiment of the present invention is used for an organic light emitting device, the light blocking film 70 may be omitted.

A buffer layer 120 is positioned on the light blocking film 70. The buffer layer 120 may include an insulating oxide such as a silicon oxide ($SiO_x$), aluminum oxide ($Al_2O_3$), hafnium oxide ($HfO_3$), and yttrium oxide ($Y_2O_3$). The buffer layer 120 prevents an impurity from flowing from the insulation substrate 110 into the semiconductor to be deposited later, thus protecting the semiconductor and improving an interface characteristic of the semiconductor. A thickness of the buffer layer 120 is in a range of more than about 500 Å to less than about 1 μm, but is not limited thereto.

A semiconductor 134, a source electrode 133, and a drain electrode 135 are formed on the buffer layer 120.

The semiconductor 134 may include an oxide semiconductor material. The oxide semiconductor material is a metal oxide semiconductor made of a metal oxide of zinc (Zn), indium (In), gallium (Ga), tin (Sn), or titanium (Ti), or a combination of the metal of zinc (Zn), indium (In), gallium (Ga), tin (Sn), titanium (Ti), or metal oxides thereof. For example, the oxide semiconductor material may include at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

When the light blocking film 70 is provided, the semiconductor 134 may be covered by the light blocking film 70.

Referring to FIGS. 23A and 23B, the source electrode 133 and the drain electrode 135, respectively, are positioned at sides of the semiconductor 134, and the source electrode 133 and the drain electrode 135 are separated from each other.

The source electrode 133 and the drain electrode 135 have conductivity, and may include the same material as the semiconductor material of the semiconductor 134 and a semiconductor material reduced from the semiconductor material of the semiconductor 134. A metal such as indium (In) included in the semiconductor material may be extracted to the surface of the source electrode 133 and the surface of the drain electrode 135.

Low conductive regions 136 are respectively positioned between the semiconductor 134 and the source electrode 133 and between the semiconductor 134 and the drain electrode 135. The low conductive region 136 positioned between the semiconductor 134 and the source electrode 133 contacts the semiconductor 134 and the source electrode 133, and the low conductive region 136 positioned between the semiconductor 134 and the drain electrode 135 contacts the semiconductor 134 and the drain electrode 135 to be connected thereto.

The carrier concentration of the low conductive region 136 is higher than the carrier concentration of the semiconductor 134 but is lower than the carrier concentration of the source electrode 133 and the drain electrode 135. The low conductive region 136 has a lower conductivity than conductivities of the source electrode 133 and the drain electrode 135. The carrier concentration of the low conductive region 136 may be gradually decreased from the source electrode 133 and the drain electrode 135 toward the semiconductor 134.

A metal such as indium (In) included in the semiconductor material may be extracted to the surface of the low conductive region 136.

An insulating layer 142 is positioned on the semiconductor 134. The insulating layer 142 may cover the semiconductor 134 and the low conductive region 136. The insulating layer 142 might not substantially overlap the source electrode 133 or the drain electrode 135.

The insulating layer 142 may be a singular layer or may include at least two layers.

When the insulating layer 142 is a singular layer, the insulating layer 142 may include an insulating oxide such as a silicon oxide ($SiO_x$), aluminum oxide ($Al_2O_3$), hafnium oxide ($HfO_3$), and yttrium oxide ($Y_2O_3$). The insulating layer 142 may improve interface characteristics of the semiconductor 134 and may prevent an impurity from penetrating into the semiconductor 134.

When the insulating layer 142 has a multilayered structure, the insulating layer 142 may include a lower layer 142a and an upper layer 142b shown in FIG. 23A. The lower layer 142a includes an insulating oxide such as a silicon oxide (SiO$_x$), aluminum oxide (Al$_2$O$_3$), hafnium oxide (HfO$_3$), and yttrium oxide (Y$_2$O$_3$), and thus, the interface characteristics of the semiconductor 134 may be improved and the penetration of an impurity into the semiconductor 134 may be prevented. The upper layer 142b may be made of various insulating materials such as a silicon nitride (SiN$_x$) and a silicon oxide (SiO$_x$). For example, the insulating layer 142 may include a lower layer of an aluminum oxide (AlO$_x$) and an upper layer of a silicon oxide (SiO$_x$). The thickness of the lower layer may be less than about 500 Å, and the thickness of the upper layer may be more than about 500 Å and less than about 1500 Å, but is not limited thereto. As another example, the insulating layer 142 may include a lower layer of silicon oxide (SiO$_x$) and an upper layer of silicon nitride (SiNx). The thickness of the lower layer may be about 2000 Å, and the thickness of the upper layer may be about 1000 Å, but is not limited thereto.

The thickness of the insulating layer 142 may be more than about 1000 Å and less than about 5000 Å, but is not limited thereto. The thickness of the insulating layer 142 may be controlled, maximizing the characteristics of the thin film transistor.

A gate electrode 154 is positioned on the insulating layer 142. An edge boundary of the gate electrode 154 is positioned inside an edge boundary of the insulating layer 142. Accordingly, the insulating layer 142 includes an outer boundary portion 144 that is not covered by the gate electrode 154. The outer boundary portion 144 overlaps the low conductive region 136 and covers the low conductive region 136. The edge boundary of the outer boundary portion 144 and the edge boundary of the low conductive region 136 may be substantially aligned with each other.

A width d1 of a lower end of the outer boundary portion 144 is larger than 0, and may be controlled according to a required length of the low conductive region 136.

The width d3 of the lower end of the insulating layer 142 in the channel length direction may be larger than the width d2 of the lower end of the gate electrode 154 in the channel length direction and may be smaller than about three times the width d2 of the lower end of the gate electrode 154 in the channel length direction.

Referring to FIGS. 23A and 23B, the gate electrode 154 overlaps the semiconductor 134 and covers the semiconductor 134. Low conductive regions 136 are positioned at two opposite sides of the semiconductor 134 with respect to the gate electrode 154, and the source electrode 133 and the drain electrode 135 are positioned at sides the low conductive region 136. The low conductive region 136, the source electrode 133, and the drain electrode 135 do not substantially overlap the gate electrode 154. Accordingly, the parasitic capacitance between the gate electrode 154 and the source electrode 133 or the parasitic capacitance between the gate electrode 154 and the drain electrode 135 may be decreased.

The gate electrode 154 may be made of a metal such as aluminum (Al), silver (Ag), copper (Cu), molybdenum (Mo), chromium (Cr), tantalum (Ta), titanium (Ti), or alloys thereof. The gate electrode 154 may have a single-layered or multilayered structure. The multilayered structure may be a dual-layered structure including a lower layer of titanium (Ti), tantalum (Ta), molybdenum (Mo), or ITO and an upper layer such as copper (Cu), and a triple-layered structure of molybdenum (Mo)-aluminum (Al)-molybdenum (Mo). However, the gate electrode 154 may be made of various metals or conductors.

According to an exemplary embodiment of the present invention, the boundary between the low conductive region 136 and the source electrode 133 may be substantially aligned with the edge boundary of the insulating layer 142, and the edge boundary of the gate electrode 154 may be substantially aligned with the boundary between the semiconductor 134 and the low conductive region 136.

The gate electrode 154, the source electrode 133, and the drain electrode 135, along with the semiconductor 134, form a thin film transistor (TFT) Q. The channel of the thin film transistor Q is formed in the semiconductor 134.

According to an exemplary embodiment of the present invention, the low conductive region 136 may increase the resistance to a current flowing from the source electrode 133 or the drain electrode 135 to the semiconductor 134. For example, the low conductive region 136 may have a function substantially corresponding to a lightly doped drain (LDD) region of a metal oxide silicon field effect transistor (MOSFET).

For example, when the size of the thin film transistor Q is gradually decreased and thus the channel length of the thin film transistor Q is decreased, the electric field between the source electrode 133 and the drain electrode 135 is increased, and thus, mobility of the carrier may be excessively increased. Thus, hot carriers may be generated. The hot carriers may exit the insulating layer 142. The hot carriers may also be accumulated in the insulating layer 142, thus deteriorating the electrical characteristics of the thin film transistor Q.

However, according to an exemplary embodiment of the present invention, when the low conductive region 136 is formed by forming the outer boundary portion 144 of the insulating layer 142, the carrier concentration is gradually varied between the semiconductor 134 and the source electrode 133 or the drain electrode 135, and thus, the generation of the hot carriers may be suppressed and the channel length of the semiconductor 134 may be prevented from being decreased. Accordingly, a drastic increase in current to the semiconductor 134 may be prevented, and the characteristics of the thin film transistor Q may be stabilized and improved.

The distance between the gate electrode 154 and the source electrode 133 or the drain electrode 135 may be increased by the outer boundary portion 144 of the insulating layer 142, and thus, a leakage path between the gate electrode 154 and the source electrode 133 or the drain electrode 135 may be increased and a short circuit between the gate electrode 154 and the source electrode 133 or the drain electrode 135 may be prevented. Accordingly, the thickness of the insulating layer 142 may be further decreased, and thus, an on-current of the thin film transistor Q may be increased.

A passivation layer 160 is positioned on the gate electrode 154, the source electrode 133, the drain electrode 135, and the buffer layer 120. The passivation layer 160 may be made of an inorganic insulating material such as a silicon nitride or silicon oxide, or an organic insulating material. The passivation layer 160 has a contact hole 163 exposing the source electrode 133 and a contact hole 165 exposing the drain electrode 135.

A data input electrode 173 and a data output electrode 175 may be positioned on the passivation layer 160. The data input electrode 173 is electrically connected to the source electrode 133 of the thin film transistor Q through the contact hole 163 of the passivation layer 160, and the data output electrode 175 is electrically connected to the drain electrode 135 of the thin film transistor Q through the contact hole 165 of the passivation layer 160.

Alternatively, a color filter (not shown) or an organic layer (not shown) made of an organic material may be further positioned on the passivation layer 160, and the data input electrode 173 and the data output electrode 175 may be positioned on the color filter or organic layer.

FIG. 24 to FIG. 33 are cross-sectional views sequentially showing a method of manufacturing a thin film transistor array panel as shown in FIG. 23, according to an exemplary embodiment of the present invention.

Figure 24:
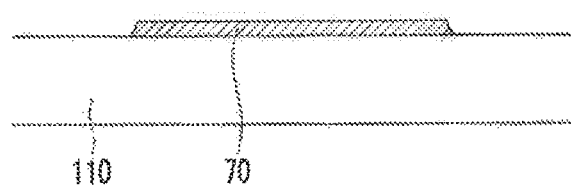
FIG. 24 to FIG. 33 are views sequentially showing a manufacturing method of the thin film transistor array panel shown in FIG. 23 according to an exemplary embodiment of the present invention.

Referring to FIG. 24, the light blocking film 70 made of an organic insulating material, an inorganic insulating material, or a conductive material such as a metal is formed on the insulation substrate 110 made of glass or plastic. Alternatively, forming of the light blocking film 70 may be omitted.

Figure 25:
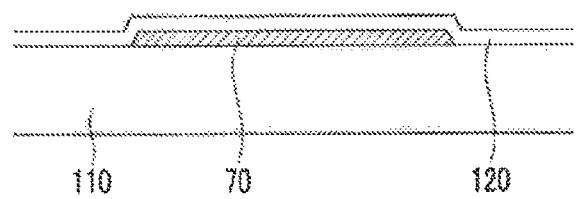

Referring to FIG. 25, the buffer layer 120 made of an insulating material including an oxide such as a silicon oxide ($SiO_x$), aluminum oxide ($Al_2O_3$), hafnium oxide ($HfO_3$), and yttrium oxide ($Y_2O_3$) is formed on the light blocking film 70 by a chemical vapor deposition (CVD) method. A thickness of the buffer layer 120 is in a range of more than about 500 Å and less than about 1 μm, but is not limited thereto.

Figure 26:
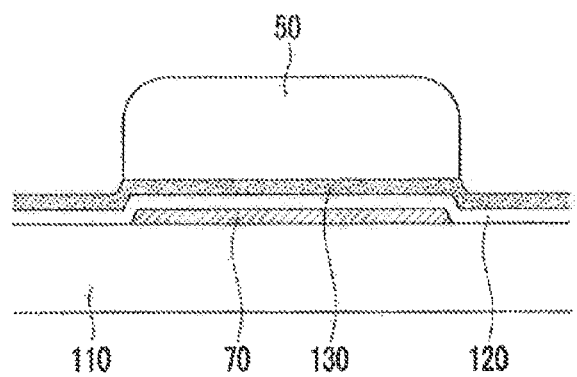

Referring to FIG. 26, the semiconductor layer 130 made of an oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO) is coated on the buffer layer 120.

A photosensitive film of a photoresist is coated on the semiconductor layer 130 and is exposed, forming a photosensitive film pattern 50. The photosensitive film pattern 50 may overlap at least a portion of the light blocking film 70.

Figure 27:
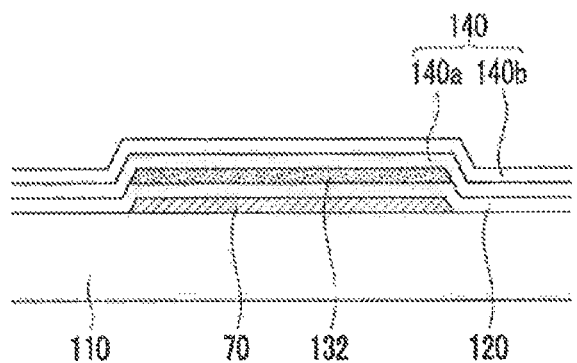

Referring to FIG. 27, the semiconductor layer 130 is etched by using the photosensitive film pattern 50 as a mask, forming a semiconductor pattern 132.

An insulating material layer 140 is formed on the semiconductor pattern 132 and the buffer layer 120. The insulating material layer 140 may be a single layer including an insulating oxide of silicon oxide ($SiO_x$), or as shown in FIG. 27, the insulating material layer 140 may include a multilayered structure including a lower layer 140a including an insulating oxide such as a silicon oxide ($SiO_x$) and the upper layer 140b including an insulating material. The thickness of the insulating material layer 140 may be more than about 1000 Å and less than about 5000 Å, but is not limited thereto.

Figure 28:
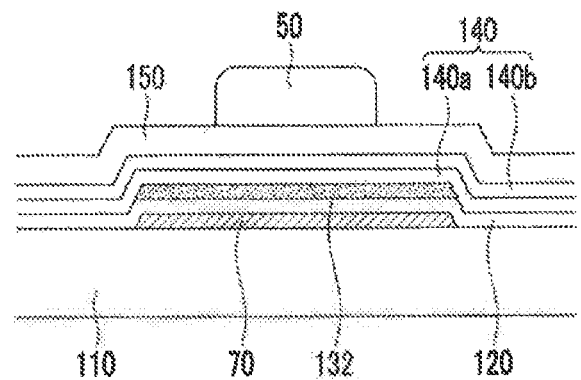

Referring to FIG. 28, a conductive material such as a metal is deposited on the insulating material layer 140 and the deposited conductive material is patterned, forming a gate layer 150. A photosensitive film is coated on the gate layer 150 and is exposed, forming a photosensitive film pattern 50. The photosensitive film pattern 50 overlaps a portion of the semiconductor pattern 132.

Figure 29:
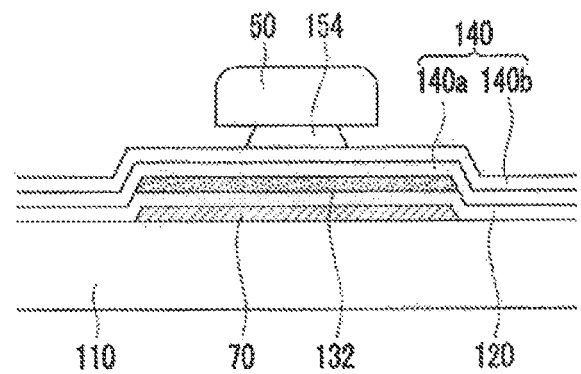

Referring to FIG. 29, the gate layer 150 is etched by using the photosensitive film pattern 50 as a mask, forming the gate electrode 154. A wet etching method may be used, and the edge boundary of the gate electrode 154 is formed inside the edge boundary of the photosensitive film pattern 50 by controlling the degree of the etching. The gate electrode 154 is formed, crossing a middle portion of the semiconductor pattern 132, and thus two portions of the semiconductor pattern 132 positioned on two opposite sides of the overlapping portion of the gate electrode 154 and the semiconductor pattern 132 are not covered by the gate electrode 154.

Figure 30:
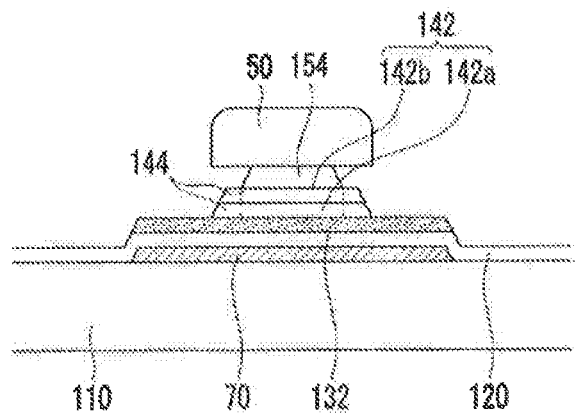

Referring to FIG. 30, the insulating material layer 140 is patterned by using the gate electrode 154 as an etching mask, forming the insulating layer 142. A dry etching method may be used. The edge boundary of the insulating layer 142 is formed outside the edge boundary of the gate electrode 154. Also, the buffer layer 120 might not be etched by controlling an etching gas and an etching time.

Two portions of the semiconductor pattern 132 that are covered by the insulating layer 142 are positioned at two opposite sides of the overlapping portion of the insulating layer 142 and the semiconductor pattern 132.

The insulating layer 142 may be a single layer, or the insulating layer 142 may include a double-layered structure including the lower layer 142a including an insulating oxide and the upper layer 142b including an insulating material.

Figure 31:
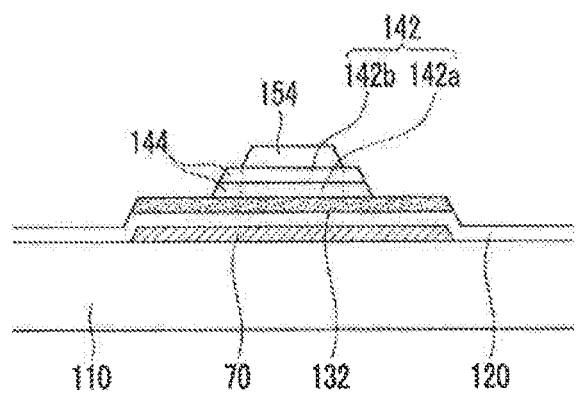

Referring to FIG. 31, the photosensitive film pattern 50 is removed. Before the removal of the photosensitive film pattern 50, an ashing process may be performed using an oxygen gas.

Figure 32:
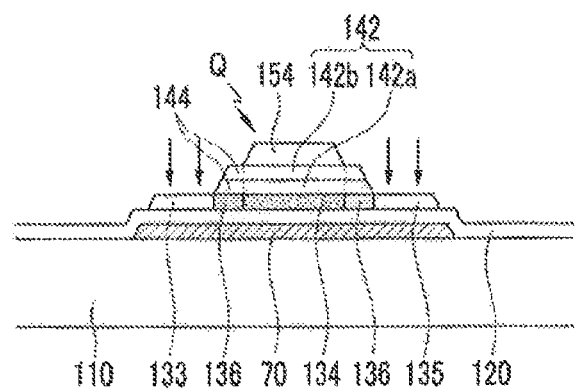

Referring to FIG. 32, the two exposed portion of the semiconductor pattern 132 are reduced, forming the source electrode 133 and the drain electrode 135 having conductivity. The region of the semiconductor pattern 132 that does not overlap the gate electrode 154 and overlaps the insulating layer 142, for example, the region of the semiconductor pattern 132 overlapping the outer boundary portion 144 of the insulating layer 142, is subjected to reduction whose level decreases towards the inside of the semiconductor pattern 132, forming the low conductive region 136. The semiconductor pattern 132 overlapping the gate electrode 154 becomes the semiconductor 134.

A heat treatment method may be used in a reduction atmosphere, reducing the exposed semiconductor pattern 132. Alternatively, a gas plasma using a plasma such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), and fluoroform ($CHF_3$) may be used, thus reducing the exposed semiconductor pattern 132.

At least a portion of the semiconductor material forming the reduced and exposed semiconductor pattern 132 may be reduced, leaving a metallic bond. Accordingly, the reduced semiconductor pattern 132 has conductivity, forming the source electrode 133 and the drain electrode 135.

A gas such as hydrogen penetrates into the semiconductor pattern 132 overlapping the outer boundary portion 144 of the insulating layer 142 during the reduction treatment, and thus, the semiconductor pattern 132 is reduced to some degree. The carrier concentration of the low conductive region 136 formed may be gradually decreased according to the degree of the penetration degree of the gas.

During the reduction treatment of the semiconductor pattern 132, the metal component of the semiconductor material, for example, indium (In), may be extracted to the surface on the semiconductor pattern 132. The thickness of the extracted metal layer may be less than about 200 nm.

Figure 34:
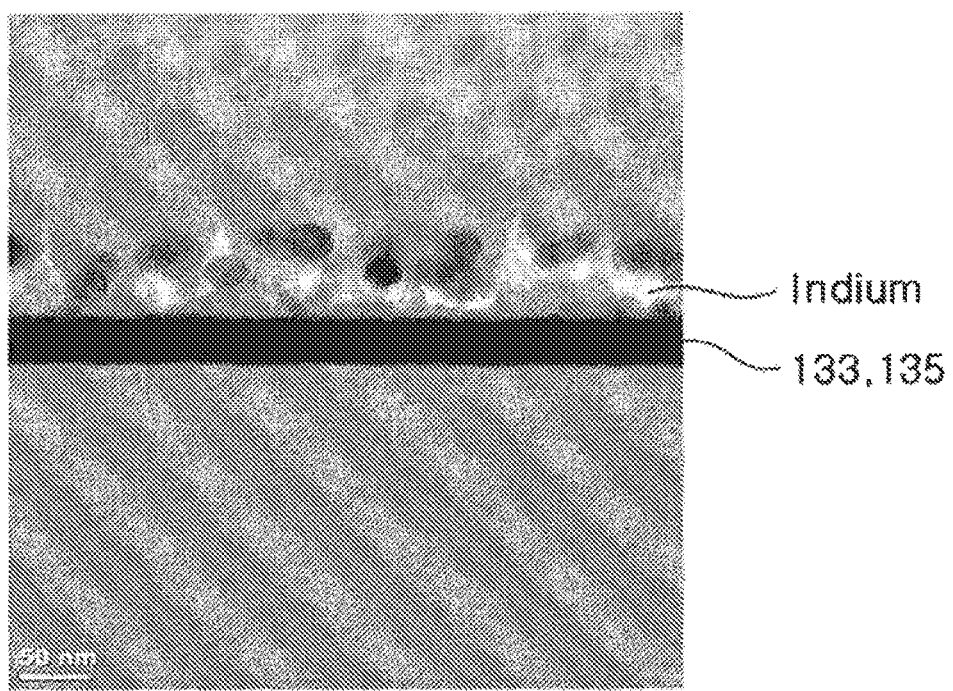
FIG. 34 to FIG. 37 are photos showing a cross-section of a thin film transistor panel including a thin film transistor according to an exemplary embodiment of the present invention.
Figure 35:
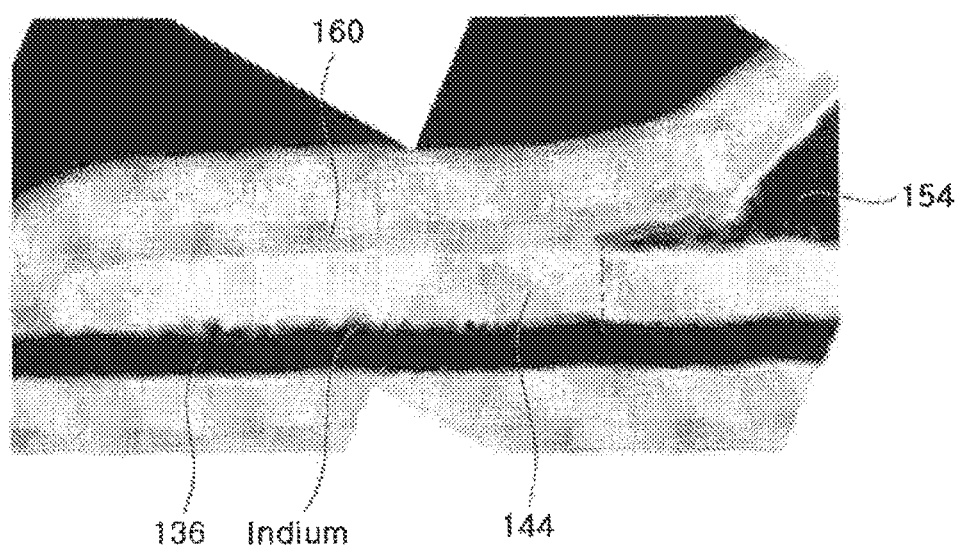

FIG. 34 and FIG. 35 are photos showing cross-sections of a thin film transistor according to an exemplary embodiment of the present invention.

Referring to FIG. 34, indium (In) particles are extracted to the surface of the source electrode 133 and the drain electrode 135 when the semiconductor material forming the semiconductor pattern 132 includes indium (In).

Referring to FIG. 35, indium (In) is extracted to a space between the outer boundary portion 144 of the insulating layer 142 and the low conductive region 136

The gate electrode 154, the source electrode 133, and the drain electrode 135, along with the semiconductor 134, form the thin film transistor Q.

Figure 33:
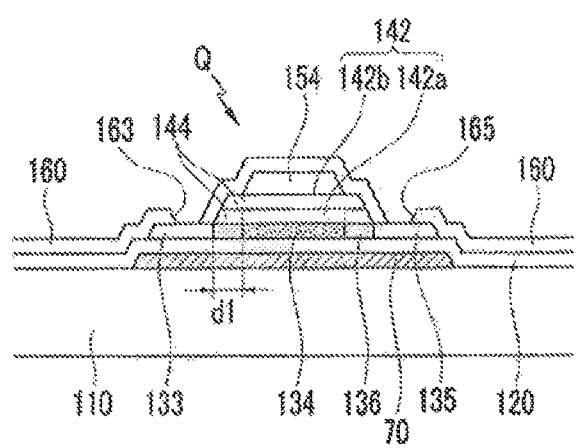

Referring to FIG. 33, an insulating material is coated on the gate electrode 154, the source electrode 133, the drain electrode 135, and the buffer layer 120, forming the passivation layer 160. The passivation layer 160 is patterned, forming a contact hole 163 exposing the source electrode 133 and a contact hole 165 exposing the drain electrode 135.

As shown in FIG. 23, a data input electrode 173 and a data output electrode 175 may be formed on the passivation layer 160.

In the thin film transistor Q according to an exemplary embodiment of the present invention, the gate electrode 154 does not substantially overlap the source electrode 133 or the drain electrode 135, and thus, the parasitic capacitance between the gate electrode 154 and the source electrode 133 or between the gate electrode 154 and the drain electrode 135 may be very small. Accordingly, the on/off characteristics of the thin film transistor Q as a switching element may be improved.

The insulating layer 142 is patterned by using the photosensitive film pattern 50 for forming the gate electrode 154, thus forming the insulating layer 142 having a wider width than the gate electrode 154, and the semiconductor pattern 132 is reduced, and thus, the insulating layer 142 may form the low conductive region 136 under the outer boundary portion 144. Accordingly, the channel length of the thin film transistor semiconductor 134 may be prevented from decreasing, hot carriers may be suppressed from being generated, the current to the semiconductor 134 may be prevented from increasing, and the characteristics of the thin film transistor Q may be stabilized and improved.

The distance between the gate electrode 154 and the source electrode 133 or the drain electrode 135 may be increased by the outer boundary portion 144 of the insulating layer 142, and thus, the leakage path between the gate electrode 154 and the source electrode 133 or the drain electrode 135 may be increased, and a short circuit between the gate electrode 154 and the source electrode 133 or the drain electrode 135 may be prevented from being formed. Accordingly, the thickness of the insulating layer 142 may be further decreased.

Figure 36:
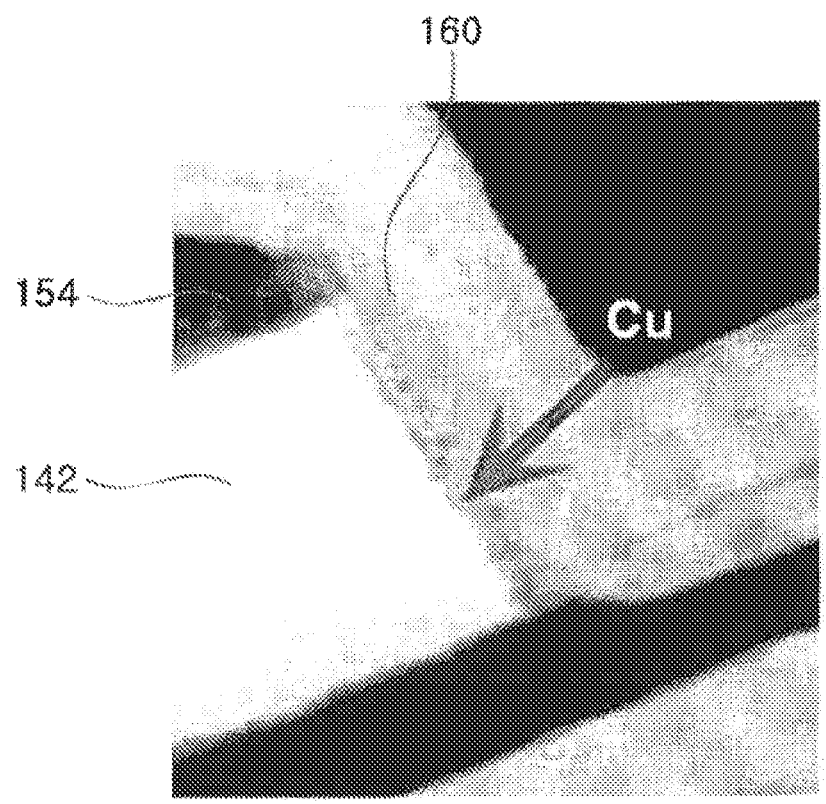
Figure 37:
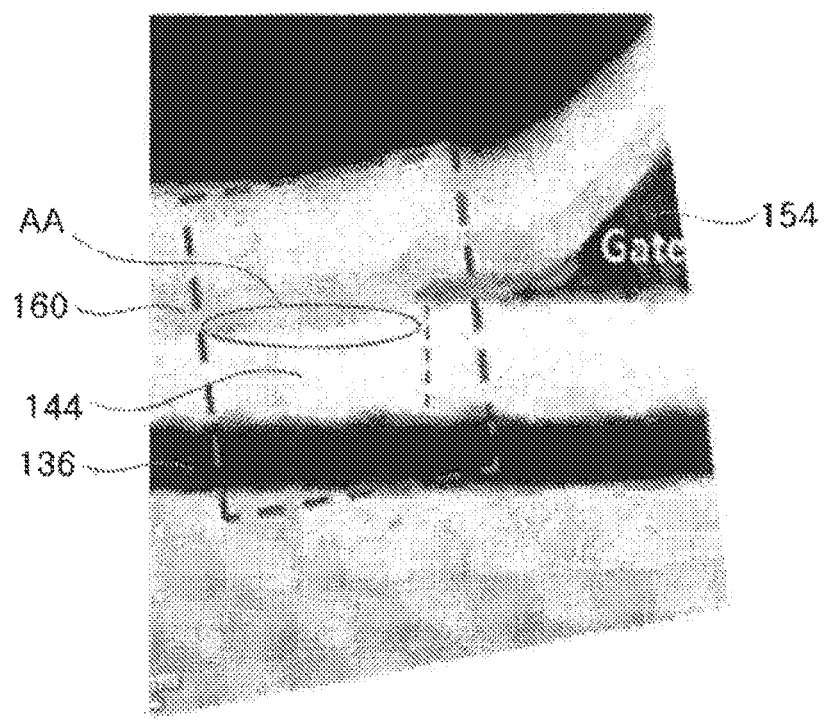
Figure 38:
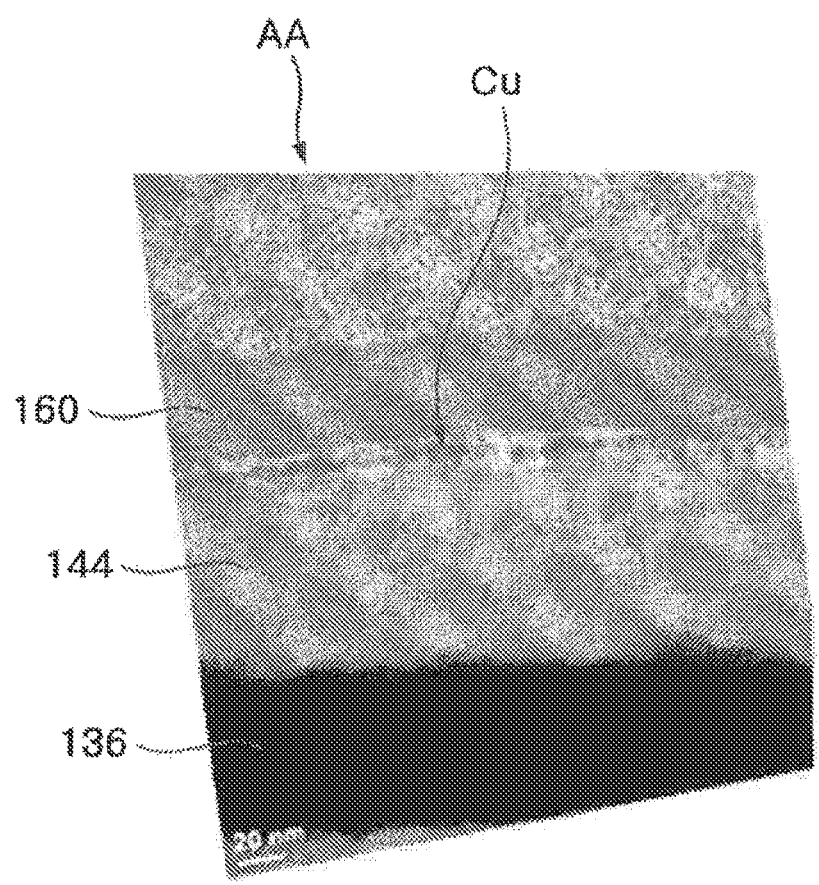
FIG. 38 is an enlarged view of the thin film transistor shown in FIG. 37.

FIG. 36 and FIG. 37 are photos showing cross-sections of a thin film transistor according to an exemplary embodiment of the present invention, and FIG. 38 is an enlarged view of a thin film transistor shown in FIG. 37, according to an exemplary embodiment of the present invention.

In the method of manufacturing the described thin film transistor, when performing the ashing process using oxygen before removing the photosensitive film pattern 50 and after forming the gate electrode 154, the metal component of the gate electrode 154 may be adhered to the surface of the insulating layer 142. FIG. 36 shows a shape of the metal component, e.g., copper (Cu), of the gate electrode 154 adhered to a side surface of the insulating layer 142 when the edge boundaries of the gate electrode 154 and the insulating layer 142 are substantially aligned with each other when the insulating layer 142 does not include the outer boundary portion 144. In this case, the gate electrode 154 may be shorted to the source electrode 133 or the drain electrode 135.

However, referring to FIG. 37 and FIG. 38, in an exemplary embodiment of the present invention, when the outer boundary portion 144 of the insulating layer 142 is formed, although the metal component, e.g., copper (Cu), of the gate electrode 154 is emitted, the metal component may be adhered to an upper surface of the outer boundary portion 144. Accordingly, the gate electrode 154 is less likely to be shorted to the source electrode 133 or the drain electrode 135, and the distance between the gate electrode 154 and the source electrode 133 or the drain electrode 135 is increased by the outer boundary portion 144 of the insulating layer 142, thus decreasing the possibility of a short circuit.

Figure 39:
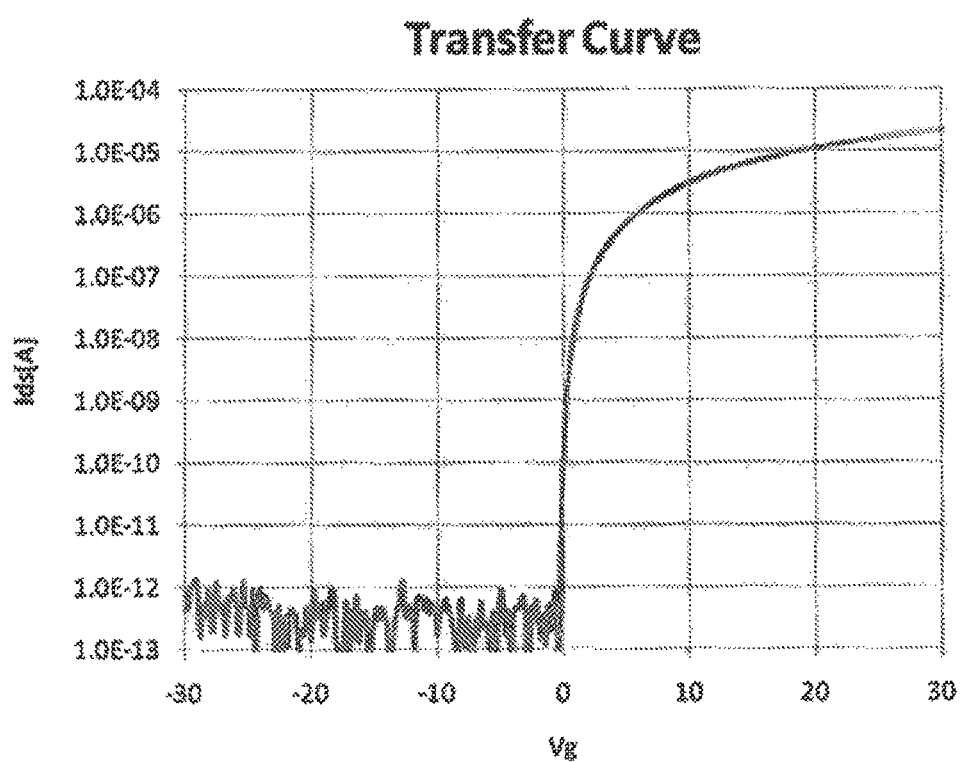
FIG. 39 and FIG. 40 are graphs showing on-current characteristics according to a gate voltage of a thin film transistor according to an exemplary embodiment of the present invention.
Figure 40:
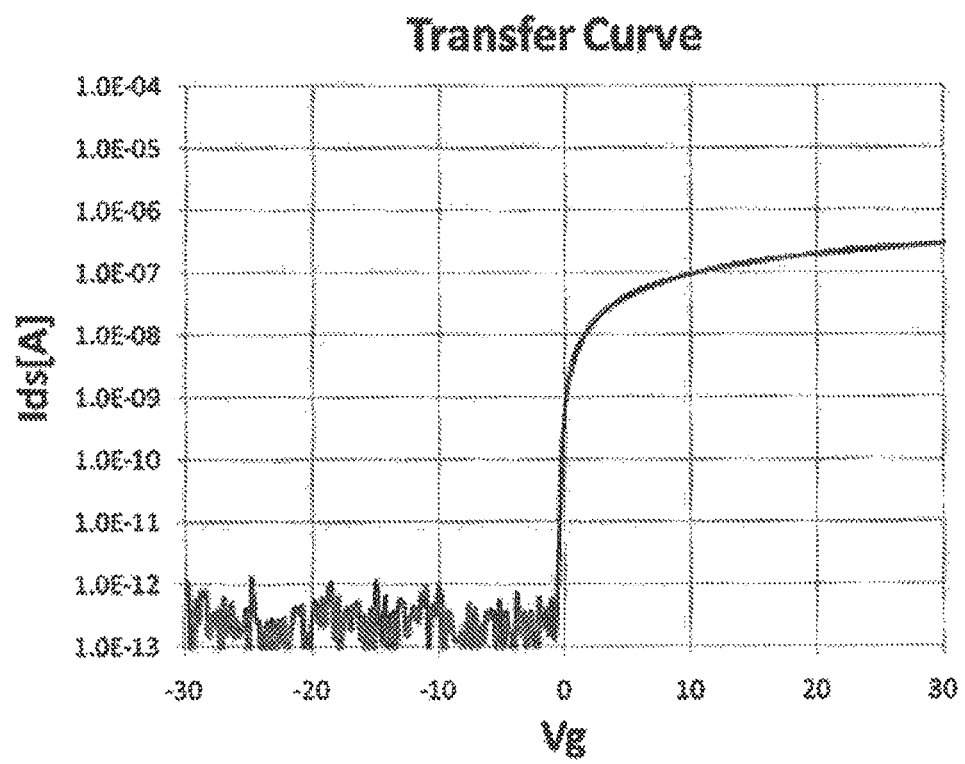

FIG. 39 and FIG. 40 are graphs showing on-current characteristics according to gate voltages of a thin film transistor according to an exemplary embodiment of the present invention.

FIG. 39 shows a source-drain current Ids when a source-drain voltage Vds is about 10 V, and FIG. 40 shows a source-drain current Ids when a source-drain voltage Vds is about 0.1 V.

Referring to FIG. 39 and FIG. 40, the turn on and turn off of the source-drain current Ids according to the gate electrode voltage Vg of the thin film transistor Q according to an exemplary embodiment of the present invention are clearly distinguished from each other with respect to a threshold voltage, and the on-current is relatively high, and thus, characteristics of the thin film transistor Q as a switching element of the thin film transistor Q is improved. Little change occurs in the threshold voltage according to a change in the source-drain voltage, and thus, the characteristics of the switching element may be maintained.

Figure 41:
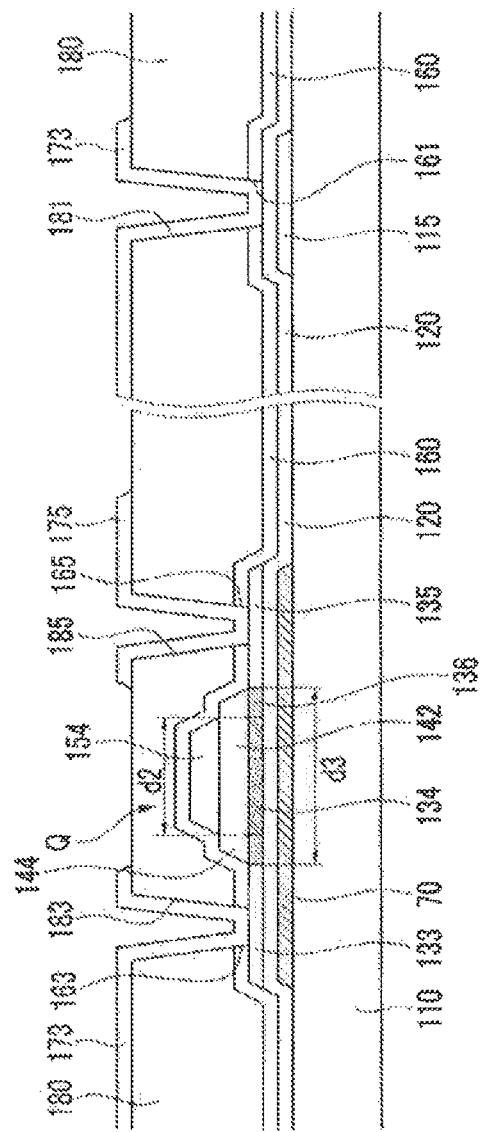
FIG. 41 is a cross-sectional view of a thin film transistor array panel including a thin film transistor according to an exemplary embodiment of the present invention.

FIG. 41 is a cross-sectional view of a thin film transistor array panel including a thin film transistor according to an exemplary embodiment of the present invention, Referring to FIG. 41, the light blocking film 70 may be positioned on the insulation substrate 110.

A data line 115 through which a data signal is transmitted may be positioned on the insulation substrate 110. The data line 115 may be made of a conductive material, e.g., a metal such as aluminum (Al), silver (Ag), copper (Cu), molybdenum (Mo), chromium (Cr), tantalum (Ta), and titanium (Ti), or alloys thereof.

The buffer layer 120 is positioned on the light blocking film 70 and the data line 115.

The semiconductor 134, the low conductive region 136, the source electrode 133, and the drain electrode 135 are formed on the buffer layer 120.

The semiconductor 134 may include an oxide semiconductor material. The semiconductor 134 may be covered by the light blocking film 70.

The source electrode 133 and the drain electrode 135 are positioned at two opposite sides with respect to the semiconductor 134 and face each other. The source electrode 133 and the drain electrode 135 are separated from each other. The low conductive region 136 is positioned between the semiconductor 134 and the source electrode 133 or the drain electrode 135. The low conductive region 136 has conductivity. The carrier concentration of the low conductive region 136 is smaller than the carrier concentration of the source electrode 133 or the drain electrode 135. The carrier concentration of the low conductive region 136 may be gradually decreased toward the semiconductor 134 from the source electrode 133 or the drain electrode 135.

The insulating layer 142 is positioned on the semiconductor 134 and the low conductive region 136. The insulating layer 142 may cover the semiconductor 134 and the low conductive region 136. The insulating layer 142 might not substantially overlap the source electrode 133 or the drain electrode 135. The insulating layer 142 may be a single layer or include a multilayer structure. For example, the insulating layer 142 may be a single layer such as a silicon oxide ($SiO_x$) or silicon nitride ($SiN^x$), and may include a lower layer of aluminum oxide ($Al_2O_3$) and an upper layer of silicon oxide ($SiO_x$). The characteristics of the insulating layer 142, described above in connection with FIGS. 23A to 40 may be applied to the insulating layer 142 illustrated in FIG. 41.

The gate electrode 154 is positioned on the insulating layer 142. The edge boundary of the gate electrode 154 is positioned inside the edge boundary of the insulating layer 142, and the insulating layer 142 that is covered by the gate electrode 154 forms the outer boundary portion 144.

The gate electrode 154 includes a portion overlapping the semiconductor 134, and the semiconductor 134 is covered by the gate electrode 154. The outer boundary portion of the insulating layer 142 overlaps the low conductive region 136.

The low conductive region 136, the source electrode 133, and the drain electrode 135 are disposed at two opposite sides of the semiconductor 134 with respect to the gate electrode 154, and the source electrode 133 and the drain electrode 135 might not substantially overlap the gate electrode 154.

The gate electrode 154, the source electrode 133, and the drain electrode 135, along with the semiconductor 134, form the thin film transistor Q.

The passivation layer 160 is positioned on the gate electrode 154, the source electrode 133, the drain electrode 135, and the buffer layer 120. The passivation layer 160 may have the contact hole 163 exposing the source electrode 133 and the contact hole 165 exposing the drain electrode 135. The buffer layer 120 and the passivation layer 160 may include a contact hole 161 exposing the data line 115.

An organic layer 180 may be further positioned on the passivation layer 160. The organic layer 180 may include an organic insulating material or a color filter material. The organic layer 180 may have a flat surface. The organic layer 180 may include a contact hole 183 exposing the source electrode 133 and corresponding to the contact hole 163 of the passivation layer 160, a contact hole 185 exposing the drain electrode 135 and corresponding to the contact hole 165 of the passivation layer 160, and a contact hole 181 exposing the data line 115 and corresponding to the contact hole 161 of the passivation layer 160 and the buffer layer 120. As shown in FIG. 41, respective edges of the contact holes 183, 185, and 181 of the organic layer 180 are respectively aligned with respective edges of the contact holes 163, 165, and 161 of the passivation layer 160. However, the respective edges of the contact holes 163, 165, and 161 of the passivation layer 160 may be respectively positioned inside the respective edges of the contact holes 183, 185, and 181 of the organic layer 180. For example, the contact holes 163, 165, and 161 of the passivation layer 160 may be respectively positioned inside the respective edges of the contact holes 183, 185, and 181 of the organic layer 180.

The data input electrode 173 and the data output electrode 175 may be positioned on the organic layer 180. The data input electrode 173 is electrically connected to the source electrode 133 of the thin film transistor Q through the contact hole 163 of the passivation layer 160 and the contact hole 183 of the organic layer 180, and the data output electrode 175 is electrically connected to the drain electrode 135 of the thin film transistor Q through the contact hole 165 of the passivation layer 160 and the contact hole 185 of the organic layer 180. The data input electrode 173 may be connected to the data line 115 through the contact hole 161 of the passivation layer 160 and the contact hole 181 of the organic layer 180. Accordingly, the source electrode 133 may receive a data signal from the data line 115. The data output electrode 175 forms a pixel electrode, controlling displaying an image, or the data output electrode 175 may be connected to a separate pixel electrode (not shown).

FIG. 42 to FIG. 49 are views sequentially showing a method of manufacturing a thin film transistor array panel shown in FIG. 41, according to an exemplary embodiment of the present invention.

Figure 42:
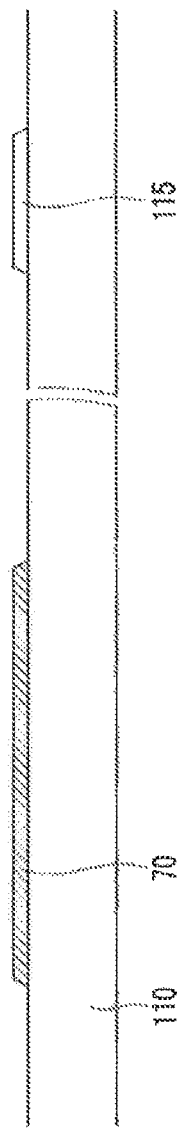
FIG. 42 to FIG. 49 are views sequentially showing a manufacturing method of the thin film transistor array panel shown in FIG. 41 according to an exemplary embodiment of the present invention.

Referring to FIG. 42, a light blocking film 70 made of an organic insulating material, an inorganic insulating material, or a conductive material such as a metal is formed on an insulation substrate 110 made of glass or plastic. Alternatively, the formation of the light blocking film 70 may be omitted.

A metal layer is deposited and patterned on the insulation substrate 110, forming the data line 115. The sequence in which the light blocking film 70 and the data line 115 are formed may be changed.

Figure 43:
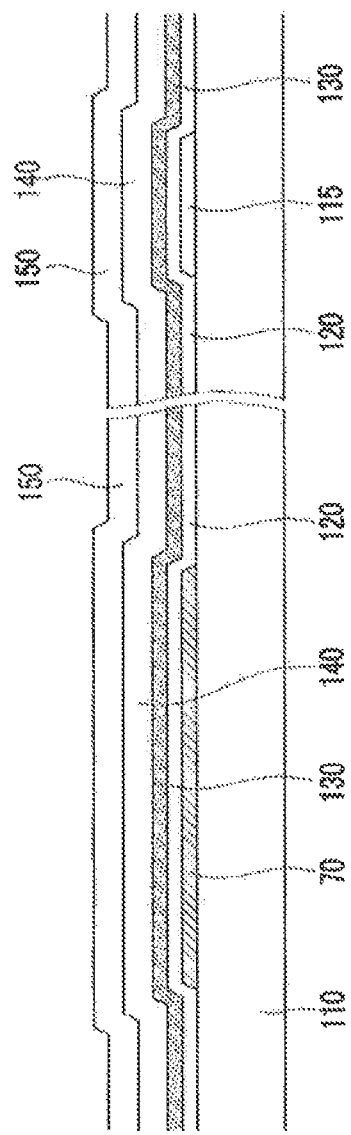

Referring to FIG. 43, a buffer layer 120, a semiconductor layer 130, an insulating material layer 140, and a gate layer 150 are sequentially deposited on the light blocking film 70 and the data line 115.

The buffer layer 120 may be formed by depositing an insulating oxide such as silicon oxide ($SiO_x$), aluminum oxide ($Al_2O_3$), hafnium oxide ($HfO_3$), or yttrium oxide ($Y_2O_3$), and the thickness of the buffer layer 120 may be in a range from more than about 500 Å to less than about 1 μm, but is not limited thereto.

The semiconductor layer 130 may be formed by depositing an oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

The insulating material layer 140 may be formed of an insulating material including an insulating oxide such as a silicon oxide ($SiO_x$). The insulating material layer 140 may be a single layer or may include a multilayered structure including a lower layer 140a including an oxide such as a silicon oxide ($SiO_x$) and an upper layer 140b including an insulating material. The thickness of the insulating material layer 140 may be in a range from more than about 1000 Å to less than about 5000 Å, but is not limited thereto.

The gate layer 150 may be formed by depositing a conductive material such as aluminum (Al).

Figure 44:
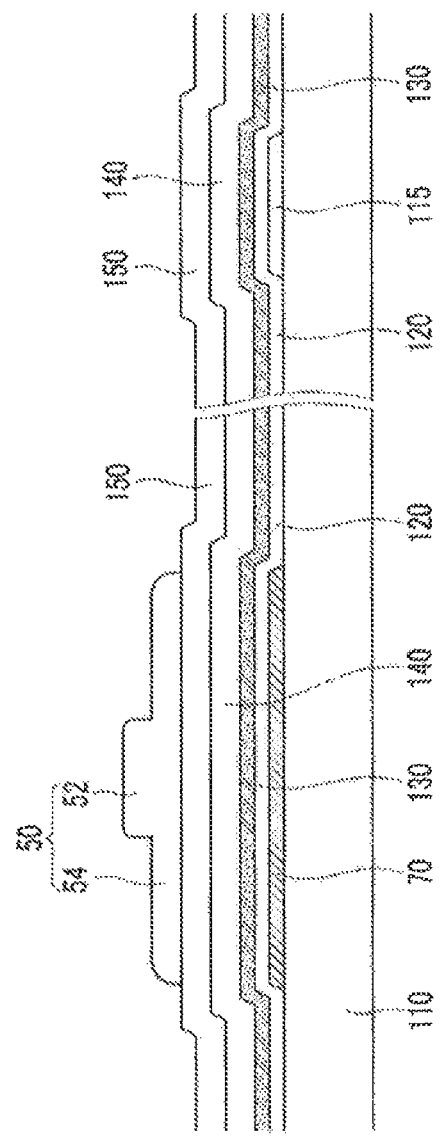

Referring to FIG. 44, a photosensitive film such as a photoresist layer is coated on the gate layer 150 and is exposed to light, forming the photosensitive film pattern 50. The photosensitive film pattern 50 includes, as shown in FIG. 44, a first portion 52 having a relatively thin thickness and a second portion 54 having a relatively thick thickness. The first portion 52 of the photosensitive film pattern 50 may be positioned at a portion overlapping the light blocking film 70. Second portions 54 that are separated from each other and face each other with respect to the first portion 52 are connected to two opposite sides, respectively, of the first portion 52 of the photosensitive film pattern 50.

The photosensitive film pattern 50 may be formed by exposing the photosensitive film to light through a photomask (not shown) including a transflective region. For example, the photomask for forming the photosensitive film pattern 50 may include a transmission region transmitting light, a light blocking region which does not transmit light, and a transflective region which partially transmits light. The transflective region may be formed by using a slit or a translucent layer.

When a negative photosensitive film is exposed to light by the photomask including the transflective region, a portion corresponding to a transmission region of the photomask is irradiated with light, forming the first portion 52 that is relatively thick. A portion corresponding to the light blocking region of the photomask is not irradiated with light, and thus, the photosensitive film is removed. A portion corresponding to the transflective region of the photomask is partially irradiated with the light, thus forming the second portion 54 that is relatively thin. For example, when a positive photosensitive film is used for the exposure, the portion corresponding to the transmission region of the photomask leaves the photosensitive film removed, and the portion corresponding to the light blocking region of the photomask may leaves the first portion 52 relatively thick. The portion corresponding to the transflective region of the photomask is partially irradiated, thus forming the second portion 54 of the photosensitive film pattern 50.

Figure 45:
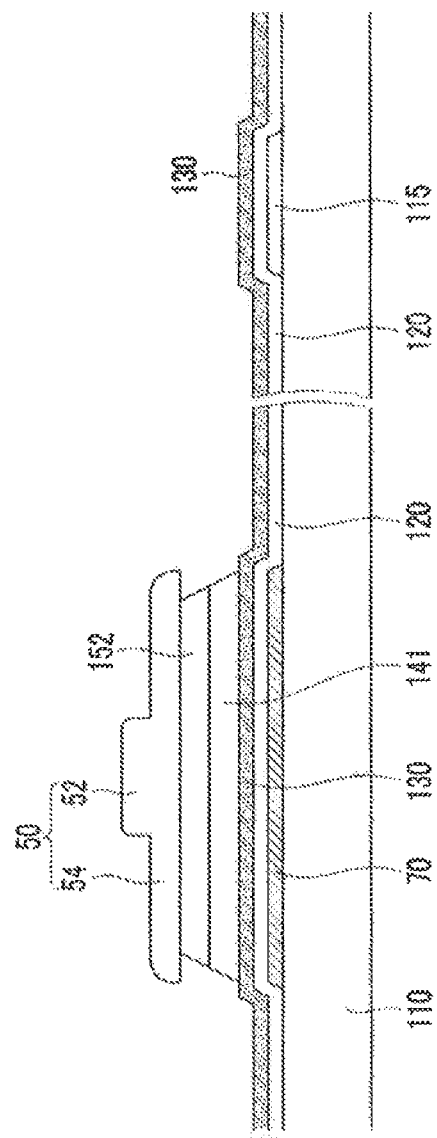

Referring to FIG. 45, the gate layer 150 and the insulating material layer 140 are sequentially etched by using the photosensitive film pattern 50 as an etching mask. The gate layer 150 may be etched through a wet etching method, and the insulating material layer 140 may be etched through a dry etching method. Accordingly, a gate pattern 152 and an insulating pattern 141 having substantially the same plane shape may be formed under the photosensitive film pattern 50. The semiconductor layer 130 that is not covered by the photosensitive film pattern 50 may be exposed.

Figure 46:
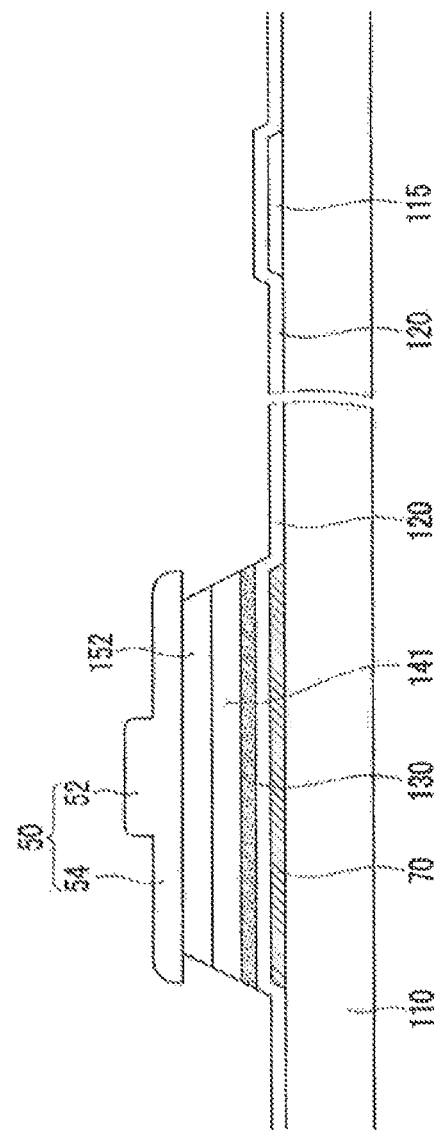

Referring to FIG. 46, the exposed semiconductor layer 130 is removed by using the gate pattern 152 and the insulating pattern 141 as an etching mask, forming a semiconductor pattern 132. The semiconductor pattern 132 may have the substantially same plane shape as the gate pattern 152 and the insulating pattern 141.

Figure 47:
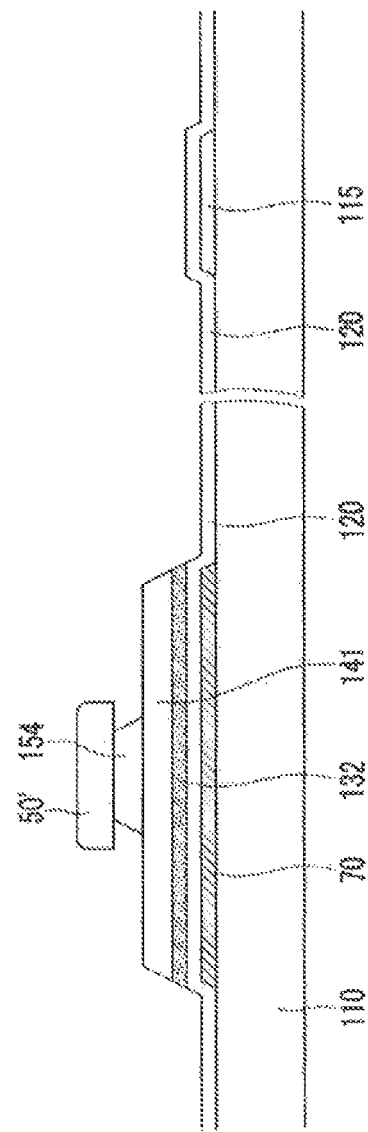

Referring to FIG. 47, the entire photosensitive film pattern 50 is etched through an ashing method using oxygen plasma, removing the second portion 54. Accordingly, the first portion 52 with a reduced thickness and a photosensitive film pattern 50' remain.

The gate pattern 152 is etched by using the photosensitive film pattern 50' as an etching mask, forming the gate electrode 154. The used etching may be wet etching, and the edge boundary of the gate electrode 154 is positioned inside the edge boundary of the photosensitive film pattern 50 by controlling the etching degree.

Figure 48:
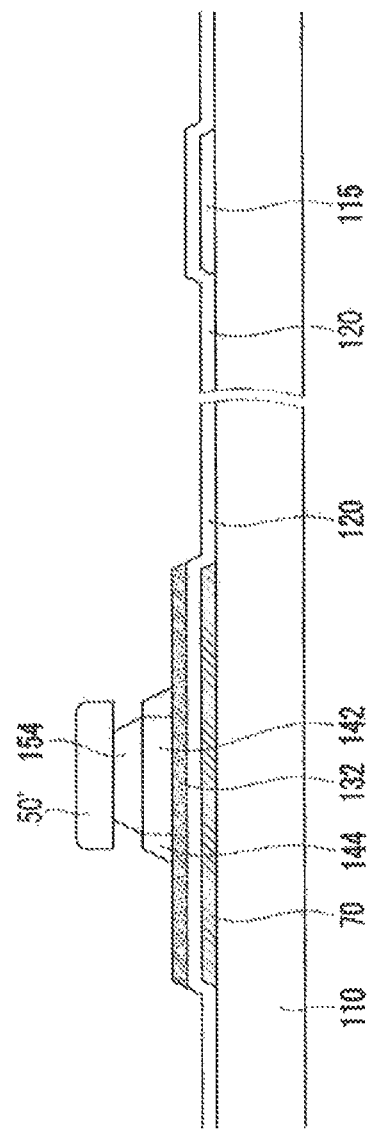

Referring to FIG. 48, the insulating pattern 141 is etched by using the photosensitive film pattern 50' as an etching mask, forming the insulating layer 142 including the outer boundary portion 144. The used etching may be a dry etching method. The edge boundary of the insulating layer 142 is formed outside the edge boundary of the gate electrode 154.

Accordingly, the semiconductor pattern 132 is not covered by the insulating layer 142, but is exposed. The exposed semiconductor pattern 132 is positioned at two opposite sides with respect to the semiconductor pattern 132 that is covered by the insulating layer 142.

Figure 49:
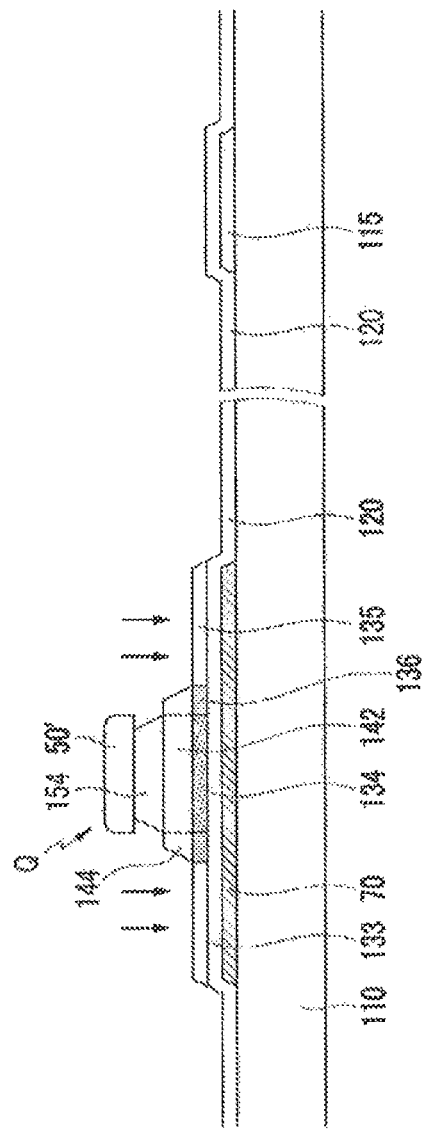

Referring to FIG. 49, the semiconductor pattern 132 undergoes a reduction treatment, forming the source electrode 133, the drain electrode 135, and the low conductive region 136 having conductivity.

A heat treatment method may be used in a reduction atmosphere as the reduction treatment method of the exposed semiconductor pattern 132, and gas plasma using plasma such as hydrogen ($H_2$), argon (Ar), nitrogen ($N_2$), nitrogen oxide ($N_2O$), and fluoroform ($CHF_3$) may be used. At least a portion of the semiconductor material forming the reduced and exposed semiconductor pattern 132 may be reduced, forming a metallic bond. Accordingly, the reduced semiconductor pattern 132 has conductivity. In the reduction treatment of the semiconductor pattern 132, the metal component, e.g., indium (In), of the semiconductor material may be extracted to the surface on the semiconductor pattern 132. The thickness of the extracted metal layer may be less than about 200 nm.

In the reduction treatment, plasma gas such as hydrogen penetrates into a space under the outer boundary portion 144 of the insulating layer 142, forming the low conductive region 136 in which the carrier concentration is gradually decreased as the plasma gas penetrates deeper. The semiconductor pattern 132 overlapping the gate electrode 154 is not reduced, forming the semiconductor 134.

The gate electrode 154, the source electrode 133, and the drain electrode 135, along with the semiconductor 134, form the thin film transistor Q.

Referring back to FIG. 41, after removing the photosensitive film pattern 50', an insulating material is coated on the gate electrode 154, the source electrode 133, the drain electrode 135, and the buffer layer 120, forming the passivation layer 160. An organic insulating material is coated on the passivation layer 160, additionally forming the organic layer 180.

The contact holes 163, 165, 161, 183, 185, and 181 are formed in the passivation layer 160 and the organic layer 180, and the data input electrode 173 and the data output electrode 175 are formed on the organic layer 180.

When forming the contact holes 163, 165, 161, 183, 185, and 181 in the passivation layer 160 and the organic layer 180, one or two masks may be used. For example, the organic layer 180 is exposed by using one photomask, forming the contact holes 183, 185, and 181 of the organic layer 180. Contact holes 163, 165, and 161 of the passivation layer 160 are formed inside the contact holes 183, 185, and 181, respectively, of the organic layer 180 by using a photomask. The respective edges of the contact holes 163, 165, and 161 of the passivation layer 160 may be respectively aligned with the respective edges of the contact holes 183, 185, and 181 of the organic layer 180, and the respective edges of the contact holes 163, 165, and 161 of the passivation layer 160 may be respectively positioned inside the respective edges of the contact holes 183, 185, and 181 of the organic layer 180.

While the invention has been shown and described with reference to exemplary embodiments thereof, it is to be understood by one of ordinary skill in the art that various changes in form and detail may be made thereto without departing from the spirit and scope of the invention as defined by the following claims.

What is claimed is:
1. A thin film transistor, comprising:
a light blocking layer;
an oxide semiconductor disposed on the light blocking layer;
a source region and a drain region positioned at two opposite sides with respect to the oxide semiconductor and positioned at a same layer as the oxide semiconductor;
an insulating layer which is positioned on and covers the oxide semiconductor;
a gate electrode positioned on the insulating layer, the light blocking layer overlapping the gate electrode with the oxide semiconductor interposed between the gate electrode and the light blocking layer;
a passivation layer disposed on the gate electrode; and
a data input electrode and a data output electrode disposed on the passivation layer,
wherein the data input electrode is connected to the source region, and the data output electrode is connected to the drain region,
wherein an edge boundary of the gate electrode is positioned inside an edge boundary of the insulating layer,
wherein the edge boundary of the insulating layer is positioned inside an edge boundary of the light blocking layer, and
wherein the passivation layer directly contacts a side surface of the insulating layer and a side surface of the gate electrode.

2. The thin film transistor of claim 1, further comprising a low conductive region positioned between the source region or the drain region and the oxide semiconductor,
   wherein the insulating layer covers the oxide semiconductor and the low conductive region, a carrier concentration of the low conductive region is lower than a carrier concentration of the source region or the drain region, and the carrier concentration of the low conductive region is gradually varied in the low conductive region.

3. The thin film transistor of claim 2,
   wherein the edge boundary of the insulating layer is substantially aligned to a boundary between the low conductive region and the source region or the drain region.

4. The thin film transistor of claim 3,
   wherein the edge boundary of the gate electrode is substantially aligned to an edge boundary of the oxide semiconductor.

5. The thin film transistor of claim 1, further comprising a buffer layer disposed between the light blocking layer and the oxide semiconductor.

6. The thin film transistor of claim 5,
   wherein the buffer layer or the insulating layer includes an insulating oxide.

7. A thin film transistor, comprising:
   an insulation substrate;
   a light blocking layer;
   an oxide semiconductor positioned on the light blocking layer;
   a source region and a drain region positioned at two opposite sides with respect to the oxide semiconductor and positioned at a same layer as the oxide semiconductor;
   an insulating layer which is positioned on and covers the oxide semiconductor,
   a gate electrode positioned on the insulating layer, the light blocking layer overlapping the gat electrode with the oxide semiconductor interposed between the gate electrode and the light blocking layer;
   a passivation layer disposed on the gate electrode; and
   a data input electrode and a data output electrode disposed on the passivation layer,
   wherein the data input electrode is connected to the source region, and the data output electrode is connected to the drain region,
   wherein an edge boundary of the gate electrode is positioned inside an edge boundary of the insulating layer,
   wherein the edge boundary of the insulating layer is positioned inside an edge boundary of the light blocking layer, and
   wherein the passivation layer directly contacts a side surface of the insulating layer and a side surface of the gate electrode.

8. The thin film transistor of claim 7, further comprising a low conductive region positioned between the source region or the drain region and the oxide semiconductor,
   wherein the insulating layer covers the oxide semiconductor and the low conductive region, a carrier concentration of the low conductive region is lower than a carrier concentration of the source region or the drain region, and the carrier concentration of the low conductive region is gradually varied in the low conductive region.

9. The thin film transistor of claim 8,
   wherein the edge boundary of the insulating layer is substantially aligned to a boundary between the low conductive region and the source region or the drain region.

10. The thin film transistor of claim 9,
    wherein the edge boundary of the gate electrode is substantially aligned to an edge boundary of the oxide semiconductor.

11. The thin film transistor of claim 7, further comprising a buffer layer disposed between the light blocking layer and the oxide semiconductor.

12. The thin film transistor of claim 11,
    wherein the buffer layer or the insulating layer includes an insulating oxide.

\* \* \* \* \*